United States Patent

Jang et al.

(10) Patent No.: US 9,570,423 B2
(45) Date of Patent: Feb. 14, 2017

(54) SEMICONDUCTOR PACKAGE AND METHOD OF MANUFACTURING THE SEMICONDUCTOR PACKAGE

(71) Applicant: Samsung Electronics Co., Ltd., Suwon-si, Gyeonggi-do (KR)

(72) Inventors: Chul-yong Jang, Hwaseong-si (KR); Young-lyong Kim, Gunpo-si (KR); Ae-nee Jang, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/957,561

(22) Filed: Dec. 2, 2015

(65) Prior Publication Data

US 2016/0086924 A1    Mar. 24, 2016

Related U.S. Application Data

(62) Division of application No. 14/328,668, filed on Jul. 10, 2014, now Pat. No. 9,245,816.

(30) Foreign Application Priority Data

Jul. 23, 2013    (KR) ........................ 10-2013-0086982

(51) Int. Cl.
*H01L 23/48*    (2006.01)
*H01L 25/065*    (2006.01)
(Continued)

(52) U.S. Cl.
CPC ......... *H01L 25/0657* (2013.01); *H01L 21/486* (2013.01); *H01L 21/4853* (2013.01);
(Continued)

(58) Field of Classification Search
USPC ......... 257/737, 678, 686, 688, 690, E23.001
See application file for complete search history.

(56) References Cited

U.S. PATENT DOCUMENTS 6,522,017 B2    2/2003    Horiuchi et al.
6,744,122 B1    6/2004    Hashimoto
(Continued)

FOREIGN PATENT DOCUMENTS

JP    H10209220 A    8/1998
JP    2002076055 A    3/2002
(Continued)

*Primary Examiner* — Timor Karimy
(74) *Attorney, Agent, or Firm* — Renaissance IP Law Group LLP

(57) ABSTRACT

Embodiments of the inventive concept include a semiconductor package having a plurality of stacked semiconductor chips. A multi-layered substrate includes a central insulation layer, an upper wiring layer disposed on an upper surface of the central insulation layer, and a first lower wiring layer disposed on a lower surface of the central insulation layer. The stacked semiconductor chips are connected to the multi-layered substrate and/or each other using various means. The semiconductor package is capable of high performance operation, like a semiconductor package based on flip-ship bonding, and also meets the need for large capacity by overcoming a limitation caused by a single semiconductor chip. Embodiments of the inventive concept also include methods of manufacturing the semiconductor package.

18 Claims, 23 Drawing Sheets

(51) Int. Cl.
  H01L 23/31    (2006.01)
  H01L 23/498   (2006.01)
  H01L 23/538   (2006.01)
  H01L 21/56    (2006.01)
  H01L 23/00    (2006.01)
  H01L 25/00    (2006.01)
  H01L 21/48    (2006.01)

(52) U.S. Cl.
  CPC ........ *H01L 21/568* (2013.01); *H01L 23/3128* (2013.01); *H01L 23/49816* (2013.01); *H01L 23/49827* (2013.01); *H01L 23/5389* (2013.01); *H01L 24/16* (2013.01); *H01L 24/19* (2013.01); *H01L 24/27* (2013.01); *H01L 24/73* (2013.01); *H01L 24/82* (2013.01); *H01L 24/96* (2013.01); *H01L 25/50* (2013.01); *H01L 23/481* (2013.01); *H01L 24/13* (2013.01); *H01L 24/32* (2013.01); *H01L 2224/11849* (2013.01); *H01L 2224/12105* (2013.01); *H01L 2224/13082* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/14155* (2013.01); *H01L 2224/16058* (2013.01); *H01L 2224/16235* (2013.01); *H01L 2224/16237* (2013.01); *H01L 2224/2746* (2013.01); *H01L 2224/2919* (2013.01); *H01L 2224/32145* (2013.01); *H01L 2224/32225* (2013.01); *H01L 2224/33181* (2013.01); *H01L 2224/48228* (2013.01); *H01L 2224/73265* (2013.01); *H01L 2224/73267* (2013.01); *H01L 2224/81191* (2013.01); *H01L 2224/81193* (2013.01); *H01L 2224/81203* (2013.01); *H01L 2224/81447* (2013.01); *H01L 2224/81815* (2013.01); *H01L 2224/8203* (2013.01); *H01L 2224/92244* (2013.01); *H01L 2224/96* (2013.01); *H01L 2224/97* (2013.01); *H01L 2225/0651* (2013.01); *H01L 2225/06513* (2013.01); *H01L 2225/06517* (2013.01); *H01L 2225/06562* (2013.01); *H01L 2225/06586* (2013.01); *H01L 2924/12042* (2013.01); *H01L 2924/15311* (2013.01); *H01L 2924/181* (2013.01); *H01L 2924/18161* (2013.01); *H01L 2924/18162* (2013.01)

(56) References Cited

U.S. PATENT DOCUMENTS

| | | | |
|---|---|---|---|
| 7,005,749 | B2 | 2/2006 | Hsu et al. |
| 7,534,660 | B2 | 5/2009 | Lee |
| 7,652,374 | B2 | 1/2010 | Kok et al. |
| 2011/0250721 | A1* | 10/2011 | Bowles ............... H01L 23/3114 438/107 |
| 2012/0107999 | A1 | 5/2012 | Fan |
| 2012/0168937 | A1 | 7/2012 | Lee |
| 2012/0244662 | A1 | 9/2012 | Kim et al. |

FOREIGN PATENT DOCUMENTS

| | | |
|---|---|---|
| JP | 2004247621 A | 9/2004 |
| KR | 101142341 | 5/2012 |

* cited by examiner

SEMICONDUCTOR PACKAGE AND METHOD OF MANUFACTURING THE SEMICONDUCTOR PACKAGE

CROSS-REFERENCE TO RELATED APPLICATIONS

This U.S. non-provisional patent application is a divisional of U.S. patent application Ser. No. 14/328,668, filed Jul. 10, 2014, which application claims the benefit of Korean Patent Application No. 10-2013-0086982, filed on Jul. 23, 2013, in the Korean Intellectual Property Office, the disclosure of which is incorporated herein in its entirety by reference.

BACKGROUND

The inventive concept relates to semiconductor packages, and more particularly, to a multi-layered semiconductor package that can be manufactured at low cost within a preset form factor, and a method of manufacturing the multi-layered semiconductor package.

In general, a packaging process is performed on semiconductor chips formed by performing several semiconductor processes on a wafer, thereby forming a semiconductor package. Such semiconductor packages may be classified into two categories: a single-layer semiconductor package in which a single semiconductor chip is stacked by flip-chip bonding, and a multi-layered semiconductor package in which a plurality of semiconductor chips are stacked by wire bonding or through silicon vias (TSVs). Recently, semiconductor packages have been more highly integrated, and also have been continuously required to provide high reliability, process simplification, a small form factor, cost effectiveness, and the like.

SUMMARY

Embodiments of the inventive concept provide a semiconductor package having a plurality of stacked semiconductor chips. The semiconductor package is capable of high performance operation, like a semiconductor package based on flip-ship bonding, and also meets the need for large capacity by overcoming a limitation caused by a single semiconductor chip. Embodiments of the inventive concept also include methods of manufacturing the semiconductor package.

Embodiments of the inventive concept also provide a semiconductor package that can be manufactured at low cost via a simple and easy process within a preset form factor, and a method of manufacturing the semiconductor package.

According to an aspect of the inventive concept, there is provided a semiconductor package including a multi-layered substrate comprising a central insulation layer, an upper wiring layer disposed on an upper surface of the central insulation layer, and a first lower wiring layer disposed on a lower surface of the central insulation layer; a first semiconductor chip disposed on the upper wiring layer and connected to buried lower pads of the first lower wiring layer via penetrating bumps that penetrate through the upper wiring layer and the central insulation layer; and a second semiconductor chip stacked on the first semiconductor chip in an offset structure such that the second semiconductor chip protrudes horizontally from the first semiconductor chip, the second semiconductor chip connected to upper pads of the upper wiring layer via upper bumps.

A plurality of first chip pads may be disposed on a first surface of the first semiconductor chip that faces the multi-layered substrate, and the penetrating bumps may connect the first chip pads to the lower pads. A plurality of second chip pads may be disposed on a protruding portion of a first surface of the second semiconductor chip that faces the multi-layered substrate, and the upper bumps may connect the second chip pads to the upper pads. The first chip pads may be arranged on a portion of the first surface of the first semiconductor chip that is not overlapped by the second semiconductor chip.

Each of the penetrating bumps may have a thickness corresponding to a sum of the thicknesses of at least the upper wiring layer and the central insulation layer, and may directly connect a first chip pad of the first semiconductor chip to a corresponding lower pad of the lower pads. Each of the upper bumps may have a thickness corresponding to at least the thickness of the first semiconductor chip, and may directly connect a second chip pad of the second semiconductor chip to a corresponding upper pad of the upper pads.

The multi-layered substrate may include an upper protection layer that covers the upper wiring layer, and a lower protection layer that covers the first lower wiring layer. The penetrating bumps may be connected to the lower pads through the upper protection layer, the upper wiring layer, and the central insulation layer. The upper bumps may be connected to the upper pads through the upper protection layer.

A portion of the first lower wiring layer may constitute the lower pads, or a conductive layer formed on the first lower wiring layer may constitute the lower pads. A portion of the upper wiring layer may constitute the upper pads, or a conductive layer formed on the upper wiring layer may constitute the upper pads.

A plurality of through holes that penetrate through the upper wiring layer and the central insulation layer may be formed in the multi-layered substrate, and sidewall conductive layers that connect the upper wiring layer to the first lower wiring layer may be formed in some of the plurality of through holes.

The second semiconductor chip may be attached to the first semiconductor chip via an attach film or a liquid adhesive. Alternatively, the second semiconductor chip may be attached to the first semiconductor chip without attach media. The first semiconductor chip may be attached to the multi-layered substrate via an attach film or a liquid adhesive. Alternatively, the first semiconductor chip is stacked on the multi-layered substrate without attach media. The first semiconductor chip may be attached to the multi-layered substrate by the penetrating bumps. The semiconductor package may include a seal that seals the upper bumps and the first and second semiconductor chips.

The multi-layered substrate may further include at least one lower insulation layer disposed on a lower surface of the first lower wiring layer. A second lower wiring layer may be formed on the at least one lower insulation layer.

The semiconductor package may further include at least one upper semiconductor chip disposed on the second semiconductor chip. The at least one upper semiconductor chip may be connected to the multi-layered substrate by using at least one of a first connection structure connected to the multi-layered substrate by wire bonding, a second connection structure connected to the multi-layered substrate via a medium bump that directly connects the at least one upper semiconductor chip to the multi-layered substrate, and a third connection structure connected to the multi-layered substrate via a through silicon via (TSV) formed in the first semiconductor chip and via a medium bump that connects the at least one upper semiconductor chip to the TSV.

According to another aspect of the inventive concept, there is provided a semiconductor package including a first semiconductor chip having a plurality of first chip pads arranged on a first surface of the first semiconductor chip along one side thereof; a second semiconductor chip stacked on the first surface of the first semiconductor chip in an offset structure such that the first chip pads are exposed; a seal that seals lateral surfaces of the first semiconductor chip and the second semiconductor chip; a first upper insulation layer that covers the seal and the second semiconductor chip and exposes second chip pads of the second semiconductor chip that are buried; and a first wiring layer that is connected to the second chip pads through the first upper insulation layer and extends along an upper surface of the first upper insulation layer.

The first chip pads may be covered by the seal, and the semiconductor package may further include a second wiring layer that is connected to the first chip pads through the seal and the first upper insulation layer and extends along the upper surface of the first upper insulation layer.

The semiconductor package may further include a protection layer that covers the first upper insulation layer and the first wiring layer and includes holes via which portions of the first wiring layer are exposed. The semiconductor package may further include external connection members disposed in the holes and connected to the first wiring layer.

The semiconductor package may further include a second upper insulation layer that covers the first upper insulation layer and the first wiring layer and includes first holes via which portions of the first wiring layer are exposed; a third wiring layer connected to the first wiring layer through the first holes and extending along an upper surface of the second upper insulation layer; and a protection layer that covers the second upper insulation layer and the third wiring layer and that includes second holes via which portions of the third wiring layer are exposed.

The seal may cover a second surface of the first semiconductor chip that is opposite to the first surface, or may expose the second surface of the first semiconductor chip.

According to another aspect of the inventive concept, there is provided a method of manufacturing a semiconductor package, the method including preparing a multi-layered substrate comprising a central insulation layer, an upper wiring layer disposed on an upper surface of the central insulation layer, and a lower wiring layer disposed on a lower surface of the central insulation layer, the multi-layered substrate having a plurality of through holes that penetrate through the upper wiring layer and the central insulation layer; inserting penetrating bumps into the plurality of through holes; stacking a first semiconductor chip on the multi-layered substrate; connecting the first semiconductor chip to buried lower pads of the lower wiring layer via the penetrating bumps; stacking a second semiconductor chip on the first semiconductor chip in an offset structure such that the second semiconductor chip protrudes horizontally from the first semiconductor chip; and connecting the second semiconductor chip to upper pads of the upper wiring layer via upper bumps.

The preparing of the multi-layered substrate may include forming the through holes by preparing a dual-sided substrate in which wiring layers are formed on both surfaces of the central insulation layer, forming an initial through hole that penetrates through the central insulation layer and the wiring layers on both surfaces of the central insulation layer, and forming a conductive layer that is connected to one of the wiring layers and blocks one entrance of the initial through hole. After the forming of the initial through hole, a portion of the wiring layer may be etched around the initial through hole such that a portion of an upper surface of the central insulation layer around the initial through hole is exposed.

Alternatively, the preparing of the multi-layered substrate further comprises preparing two single-sided substrates in each of which a wiring layer is formed on one surface of the central insulation layer, forming a first initial through hole in one of the single-sided substrates in such a way that the first initial through hole penetrates both the central insulation layer and the wiring layer, forming a second initial through hole in the other single-sided substrate in such a way that the second initial through hole penetrates only the central insulation layer, and coupling the two single-sided substrates to each other such that the first initial through hole is aligned with the second initial through hole.

After the forming of the first initial through hole, a portion of the wiring layer may be etched around the first initial through hole such that a portion of an upper surface of the central insulation layer around the first initial through hole is exposed.

After the stacking of the second semiconductor chip in the offset structure, the method may further include stacking at least one upper semiconductor chip on the second semiconductor chip. In the stacking of the at least one upper semiconductor chip, the at least one upper semiconductor chip may be connected to the multi-layered substrate by using at least one of a first connecting method of connecting the at least one upper semiconductor chip to the multi-layered substrate by wire bonding, a second connecting method of directly connecting the at least one upper semiconductor chip to the multi-layered substrate by using a medium bump, and a third connecting method of connecting the at least one upper semiconductor chip to the multi-layered substrate via a TSV formed in the first semiconductor chip and a medium bump connected to the TSV.

According to another aspect of the inventive concept, there is provided a method of manufacturing a semiconductor package, the method including disposing a first semiconductor chip on a carrier substrate such that a first surface of the first semiconductor chip on which a plurality of first chip pads are arranged faces the carrier substrate; disposing a second semiconductor chip on the first semiconductor chip such that a first surface of the second semiconductor chip on which a plurality of second chip pads are arranged faces the carrier substrate and that the plurality of second chip pads of the second semiconductor chip are exposed; forming a seal on the carrier substrate to seal lateral surfaces of the first and second semiconductor chips and second surfaces of the first and second semiconductor chips that are opposite to the first surfaces thereof; separating the carrier substrate from the first semiconductor chip and the seal; forming an upper insulation layer that covers the seal and the first surface of the first semiconductor chip and exposes the first chip pads of the first semiconductor chip that are buried; forming a first wiring layer that is connected to the first chip pads through the upper insulation layer and extends along an upper surface of the upper insulation layer; and forming a protection layer that covers the upper insulation layer and the first wiring layer and includes holes via which portions of the first wiring layer are exposed.

In the forming of the seal, the second chip pads may be covered by the seal, and the forming of the first wiring layer may include forming a second wiring layer that is connected to the second chip pads through the seal and the upper insulation layer and extends along the upper surface of the upper insulation layer.

The first wiring layer may be formed by plating. After the forming of the protection layer, external connection members connected to the first wiring layer may be disposed in the holes.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
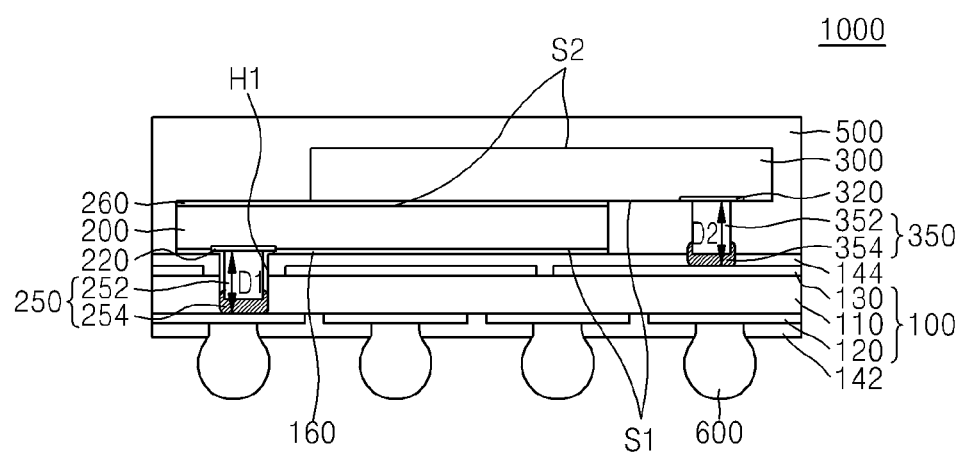
FIG. 1A is a cross-sectional view of a semiconductor package according to an embodiment of the inventive concept.

The inventive concept will now be described more fully with reference to the accompanying drawings, in which exemplary embodiments of the inventive concept are shown.

The inventive concept may, however, be embodied in many different forms and should not be construed as being limited to the embodiments set forth herein; rather, these embodiments are provided so that this disclosure will be thorough and complete, and will fully convey the inventive concept to one of ordinary skill in the art.

When an element is hereinafter referred to as being "connected" to another element, it can be directly connected to the other element or intervening elements may be present. Similarly, when an element is referred to as being "on" another element or layer, the element can be directly on another element or intervening elements may be present. In the drawings, the structure or size of each element is exaggerated for clarity and convenience of explanation, and portions not involved in the description are not illustrated. Like numbers refer to like elements throughout the specification. The terminology used herein is for the purpose of describing exemplary embodiments only and is not intended to be limiting of the inventive concept.

As used herein, the term "and/or" includes any and all combinations of one or more of the associated listed items. Expressions such as "at least one of," when preceding a list of elements, modify the entire list of elements and do not modify the individual elements of the list.

FIG. 1A is a cross-sectional view of a semiconductor package 1000 according to an embodiment of the inventive concept.

Referring to FIG. 1A, the semiconductor package 1000 may include a multi-layered substrate 100, a first semiconductor chip 200, a second semiconductor chip 300, a seal 500, and external connection members 600.

The multi-layered substrate 100 may include a central insulation layer 110, a lower wiring layer 120, and an upper wiring layer 130. The multi-layered substrate 100 may be fabricated by coating with a copper (Cu) foil a plate obtained by compressing, for example, phenol or epoxy glass (or FR-4) resin, to have a certain thickness. In other words, the plate obtained by compressing, for example, phenol or epoxy glass (or FR-4) resin, to have a certain thickness may correspond to the central insulation layer 110, and the Cu foils coated on the upper and lower surfaces of the central insulation layer 110 may be patterned into the lower wiring layer 120 and the upper wiring layer 130, respectively. The central insulation layer 110 may include paper, glass fabric, a reinforcing base, for example, in order to reinforce the intensity or minimize a temperature-dependent size variation.

In general, multi-layered substrates may be classified into two categories: a single-sided substrate in which a wiring layer is formed on only one surface of the central insulation layer 110, and a two-sided substrate in which wiring layers are respectively formed on both surfaces of the central insulation layer 110 as in the multi-layered substrate 100 according to the present embodiment. Alternatively, at least three Cu foil layers may be formed using a prepreg insulator, and accordingly at least three wiring layers may be formed on a multi-layered substrate. For reference, the term "substrate" may be replaced by a printed circuit board (PCB), and PCBs may be classified into a single-layer PCB and a 2-layer PCB.

The multi-layered substrate 100 according to the present embodiment may include a plurality of through holes H1. The through holes H1 may penetrate through the upper wiring layer 130 and the central insulation layer 110. The lower wiring layer 120 may be disposed below the through holes H1 so that the bottoms of the through holes H1 are blocked. As illustrated in FIG. 1A, penetrating bumps 250 are disposed within the through holes H1, and thus the lower wiring layer 120 may be electrically connected to the first semiconductor chip 200. A method of forming the through holes H1 in the multi-layered substrate 100 is described in more detail below with reference to FIGS. 18A through 19D.

As illustrated in FIG. 1A, the lower wiring layer 120 may be divided into a plurality of lower wiring portions. The lower wiring layer 120 may be connected directly to the penetrating bumps 250, and may also be connected to upper bumps 350 via an internal wiring (not shown) disposed within the central insulation layer 110 and the upper wiring layer 130. As illustrated in FIG. 1A, the lower wiring layer 120 is connected to the external connection members 600, and thus the penetrating bumps 250 and the upper bumps 350 may be connected to the external connection members 600.

The upper wiring layer 130 may also be divided into a plurality of upper wiring portions and may be connected to the upper bumps 350. The upper wiring layer 130 may be electrically separated from the penetrating bumps 250. The upper wiring layer 130 may be connected to the lower wiring layer 120 via the internal wiring disposed within the central insulation layer 110 and thus may be electrically connected to the external connection members 600.

The lower wiring layer 120 and the upper wiring layer 130, together with the penetrating bumps 250, the upper bumps 350, and the external connection members 600, may serve as a medium for electrically connecting the first and second semiconductor chips 200 and 300 stacked on the multi-layered substrate 100 to an external device (not shown).

Although it has been described above that the lower wiring layer 120 and the upper wiring layer 130 are formed of Cu foils, the material used to form the lower wiring layer 120 and the upper wiring layer 130 is not limited thereto. For example, the lower wiring layer 120 and the upper wiring layer 130 may be formed of aluminum (Al), nickel (Ni), or the like. Each of the lower wiring layer 120 and the upper wiring layer 130 may be a multi-layered metal wiring layer, such as a Ni/Cu layer, an Al/Ni layer, or a TiW/Ni layer, instead of a single-layered wiring layer.

The lower wiring layer 120 and the upper wiring layer 130 may function as pads. In other words, a portion of the lower wiring layer 120 that is connected to the penetrating bumps 250 may constitute a lower pad of the lower wiring layer 120, and a portion of the upper wiring layer 130 that is connected to the upper bumps 350 may constitute an upper pad of the upper wiring layer 130. Special pads may be formed, separately from the lower wiring layer 120 and the upper wiring layer 130. This is described below in more detail with reference to FIG. 2.

The lower pad of the lower wiring layer 120 may have a buried structure. In other words, lower pads of the lower wiring layer 120 may be disposed within lower parts of the through holes H1 of the multi-layered substrate 100, and the penetrating bumps 250 may be disposed on the lower pads. Accordingly, the lower pads of the lower wiring layer 120 may be buried.

Protection layers may be formed to protect the lower wiring layer 120 and the upper wiring layer 130 from external physical and/or chemical damages. In other words, a lower protection layer 142 may cover the lower wiring layer 120, and an upper protection layer 144 may cover the upper wiring layer 130. The lower and upper protection layers 142 and 144 may be formed of, for example, solder resist (SR) or dry film resist (DFR). A general insulation layer, such as an oxide layer or a nitride layer, is not excluded.

The first and second semiconductor chips 200 and 300 may be memory chips or non-memory chips. In some cases, one of the first and second semiconductor chips 200 and 300 may be a memory chip, and the other may be a non-memory chip. When the first and second semiconductor chips 200 and 300 are non-memory chips, they may be logic chips, such as, CPUs or microprocessors. When the first and second semiconductor chips 200 and 300 are memory chips, the memory chips may include various types of memories, for example, a DRAM, an SRAM, a flash memory, a PRAM, a ReRAM, a FeRAM, and an MRAM.

The first semiconductor chip 200 may be stacked on the multi-layered substrate 100 via an attach medium 160 such that a first surface S1 of the first semiconductor chip 200 on which first chip pads 220 are formed faces the multi-layered substrate 100. The first surface S1 may be an active surface on which a plurality of semiconductor devices, wires, and the first chip pads 220, for example, have been formed. The first surface S1 may be covered with a protective insulation layer (not shown), but only the first chip pads 220 may be exposed through the protective insulation layer.

The first semiconductor chip 200 may be physically and/or electrically connected to the lower wiring layer 120 of the multi-layered substrate 100 via the penetrating bumps 250, as illustrated in FIG. 1A. For example, the first semiconductor chip 200 may be connected to the lower wiring layer 120 via the penetrating bumps 250 by flip-chip bonding.

Each penetrating bumps 250 may include a metal pillar 252 and a solder 254. The metal pillar 252 may be a Cu pillar. However, the material of the metal pillar 252 is not limited thereto. For example, the metal pillar 252 may be formed of Al, Ni, gold (Au), or an alloy thereof. The metal pillar 252 may have a cylindrical shape. However, the shape of the metal pillar 252 is not limited thereto, and may be any of various shapes, such as, a polyprism or a cylindroid. For example, the metal pillars 252 may be formed on the first chip pads 220 of the first semiconductor chip 200 by electrolytic plating or electroless plating. The metal pillars 252 may be formed by deposition.

The solders 254 may be formed on the metal pillars 252 and may be formed of tin (Sn). In some cases, the solders 254 may be formed of palladium (Pd), silver (Ag), lead (Pb), or an alloy thereof. The solder 254 may have a hemispherical shape that surrounds an upper portion of the metal pillar 252. The solder 254 may have a hemispherical shape via a reflow process. For example, the solder 254 may be formed in a hemispherical shape on an upper surface of the metal pillar 252 via a reflow process. As illustrated in FIG. 1A, the solder 254 may surround the metal pillar 252 by flowing down along the lateral side of the metal pillar 252.

Each penetrating bump 250 may have a first thickness D1 corresponding to the depth of the through hole H1 of the multi-layered substrate 100. For example, the first thickness D1 of the penetrating bump 250 may correspond to a sum of the thicknesses of the upper protection layer 144, the upper wiring layer 130, and the central insulation layer 110. Accordingly, the first semiconductor chip 200 may be stacked on the multi-layered substrate 100 with a minimum distance therebetween. In more detail, since the penetrating bumps 250 each having the first thickness D1 corresponding to the depth of each through hole H1 are buried within the through holes H1 and connected to the lower wiring layer 120, the first semiconductor chip 200 may be attached and fixed onto the upper protection layer 144 of the multi-layered substrate 100 via only the attach medium 160. The attach medium 160 may be an adhesion film or a liquid adhesive, for example, a die attach film (DAF).

The second semiconductor chip 300 is stacked on the first semiconductor chip 200. As illustrated in FIG. 1A, the second semiconductor chip 300 may be stacked on the first semiconductor chip 200 to have an offset structure in which a part of the second semiconductor chip 300 protrudes horizontally from the first semiconductor chip 200. The second semiconductor chip 300 may be stacked on the first semiconductor chip 200 via an attach medium 260 such that a first surface S1 of the second semiconductor chip 300 on which second chip pads 320 are formed faces the multi-layered substrate 100. A description on the first surface S1 and the second chip pads 320 of the second semiconductor chip 300 is the same as or substantially the same as the above description on the first surface S1 and the first chip pads 220 of the first semiconductor chip 200, and therefore it is not repeated.

The second semiconductor chip 300 may be physically and/or electrically connected to the lower wiring layer 130 of the multi-layered substrate 100 via the upper bump 350. For example, the second semiconductor chip 300 may be connected to the upper wiring layer 130 via the upper bumps 350 by flip-chip bonding. Each upper bump 350 may include a metal pillar 352 and a solder 354, similar to the penetrating pumps 250. The metal pillar 352 and the solder 354 of the upper bump 350 correspond to the metal pillar 252 and the solder 254 of the penetrating pump 250, so a description thereof is omitted.

The upper bump 350 may have a second thickness D2 corresponding to the thickness of the first semiconductor chip 200. For example, the second thickness D2 of the upper bump 350 may correspond to a sum of the thicknesses of the upper protection layer 144 and the first semiconductor chip 200. Accordingly, the second semiconductor chip 300 may be connected to the upper wiring layer 130 of the multi-layered substrate 100 by flip-chip bonding while being stacked on the first semiconductor chip 200. In more detail, the upper bumps 350 each having the second thickness D2 corresponding to the thickness of the first semiconductor chip 200 may directly connect the second chip pads 320 of the second semiconductor chip 300 to the upper wiring layer 130. Accordingly, the second semiconductor chip 300 may be attached and fixed onto the first semiconductor chip 200 via the attach medium 260, with a minimum distance between the second semiconductor chip 300 and the multi-layered substrate 100. As described above, the attach medium 260 may be an adhesion film or a liquid adhesive, for example, a DAF.

The seal 500 may seal the first and second semiconductor chips 200 and 300. In other words, the seal 500 may seal the lateral surfaces and upper surfaces of the first and second semiconductor chips 200 and 300. The seal 500 may also seal a part of the upper surface of the multi-layered substrate 100.

The seal 500 may be formed of, for example, an epoxy-based material, a thermosetting material, a thermoplastic material, a UV curable material, or the like. The thermosetting material may include a phenol type, acid anhydride type, or amine type hardener and an acrylic polymer addition agent. The seal 500 may be formed of resin with a filler and the like.

The seal 500 may be formed by general molding or by molded underfilling (MUF). When the seal 500 is formed by MUF, a material that covers the outskirts of the first and second semiconductor chips 200 and 300 may be the same as or substantially the same as a material with which a space between the second semiconductor chip 300 and the multi-layered substrate 100 is filled.

The external connection members 600 may be disposed on a lower surface of the multi-layered substrate 100 and may penetrate through the lower protection layer 142 so as to be physically and/or electrically connected to the lower wiring layer 120. The external connection members 600 may be, for example, bumps or solder balls. The semiconductor package 1000 may be mounted on an external device (not shown) via the external connection members 600. As described above, the external connection members 600 may be electrically connected to the first semiconductor chip 200 and the second semiconductor chip 300 via the lower wiring layer 120, the internal wiring, the upper wiring layer 130, the penetrating bumps 250, the upper bumps 350, and the like. Accordingly, the first semiconductor chip 200 and the second semiconductor chip 300 may be electrically connected to an external device via the external connection members 600.

The semiconductor package 1000 according to the present embodiment may have a structure in which the first semiconductor chip 200 is connected to the multi-layered substrate 100 by using the penetrating bumps 250 with a minimum distance between the first semiconductor chip 200 and the multi-layered substrate 100 by flip-chip bonding. In addition, the semiconductor package 1000 may have a structure in which the second semiconductor chip 300 stacked on the first semiconductor chip 200 to have an offset structure is directly connected to the multi-layered substrate 100 by using the upper bumps 350 by flip-chip bonding. Since a semiconductor package having this structure has two semiconductor chips stacked by flip-chip bonding, it may overcome the restriction that only one semiconductor chip can be packaged by flip-chip bonding.

The semiconductor package 1000 according to the present embodiment need not use wire bonding or through silicon vias (TSVs), and thus may be manufactured as a multi-layered semiconductor package at low costs via a simple and easy process with a small form factor.

The semiconductor package 1000 according to the present embodiment is able to operate fast due to flip-ship bonding, and may satisfy a need for large capacity due to a multi-layered semiconductor package structure in which a plurality of semiconductor chips are stacked.

Figure 1B:
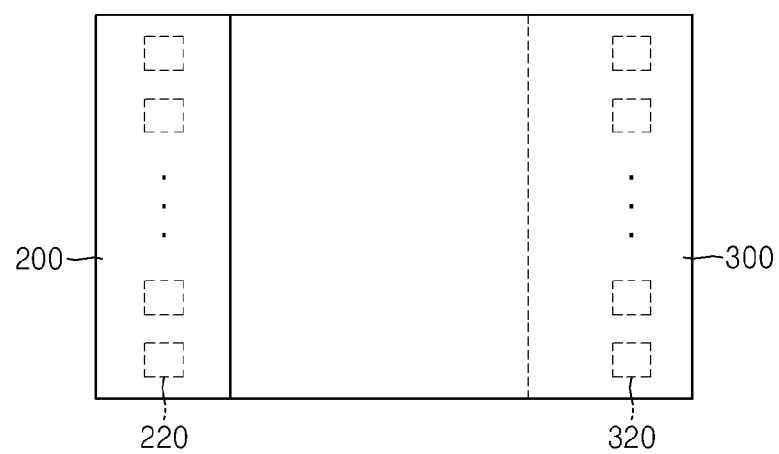
FIG. 1B is a plan view illustrating an offset stack structure of a first semiconductor chip and a second semiconductor chip, in which the position of chip pads has been reflected, in the semiconductor package of FIG. 1A.

FIG. 1B is a plan view illustrating the offset stack structure of the first and second semiconductor chips 200 and 300, respectively, in which the positions of the first and second chip pads 220 and 320 have been reflected, in the semiconductor package 1000 of FIG. 1A.

Referring to FIG. 1B, the first and second semiconductor chips 200 and 300 may be stacked in an offset structure in which a part of the second semiconductor chip 300 is overlapped with the first semiconductor chip 200 and the other part protrudes from the first semiconductor chip 200. Due to this offset stacking of the second semiconductor chip 300 on the first semiconductor chip 200, the second chip pads 320 of the second semiconductor chip 300 may be exposed, and thus may be connected to the upper wiring layer 130 via the upper bumps 350. In FIG. 1B, a dotted straight line indicates a right side of the first semiconductor chip 200.

For example, as illustrated in FIG. 1B, the second chip pads 320 of the second semiconductor chip 300 may be arranged along the right side surface of the second semiconductor chip 300. According to arrangement of the second chip pads 320 along the right side surface of the second semiconductor chip 300 as described above, the second semiconductor chip 300 may be stacked on the first semiconductor chip 200 such as to be biased rightward so that the second chip pads 320 are exposed.

The first chip pads 220 of the first semiconductor chip 200 may be arranged along one side surface of the first semiconductor chip 200. The first chip pads 220 may be arranged along a surface of the first semiconductor chip 200 that is not overlapped by the second semiconductor chip 300. For example, the first chip pads 220 may be arranged along a left side surface of the first semiconductor chip 200 that is not overlapped by the second semiconductor chip 300.

However, the location on the first semiconductor chip 200 where the first chip pads 220 are arranged is not limited thereto. Since the first semiconductor chip 200 is not blocked by anything over the multi-layered substrate 100 in contrast with the second semiconductor chip 300 (that is, the second semiconductor chip 300 is blocked by the first semiconductor 200 over the multi-layered substrate 100), the first chip pads 220 may be formed on any part of the first semiconductor chip 200. However, because the penetrating bumps 250 should be buried in the through holes H1, the first chip pads 220 of the first semiconductor chip 200 may be arranged to face the through holes H1. For example, when the through holes H1 are arranged in a part of the multi-layered substrate 100 that corresponds to the center of the first semiconductor chip 200, the first chip pads 220 may also be arranged on the center of the first semiconductor chip 200.

Although the first chip pads 220 of the first semiconductor chip 200 and the second chip pads 320 of the second semiconductor chip 300 are arranged in respective lines in the present embodiment, the arrangements of the first chip pads 220 and the second chip pad 320 are not limited thereto. For example, the first chip pads 220 and the second chip pads 320 may be each arranged in at least two lines, or the like.

FIGS. 2 through 5 are cross-sectional views of semiconductor packages 1000a, 1000b, 1000c, and 1000d, respectively, according to embodiments of the inventive concept. For convenience of explanation, matters described above with reference to FIG. 1A are briefly described, or otherwise not repeated herein.

Figure 2:
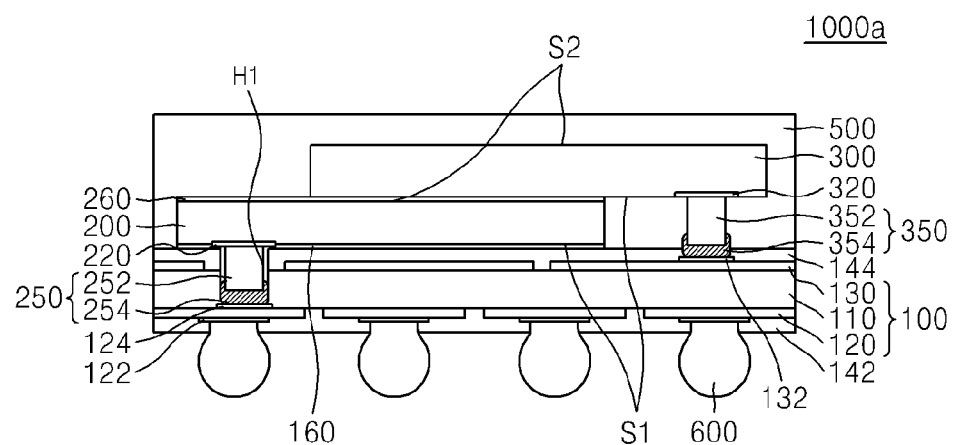
FIGS. 2 through 5 are cross-sectional views of semiconductor packages according to embodiments of the inventive concept.

Referring to FIG. 2, the semiconductor package 1000a may be different from the semiconductor package 1000 of FIG. 1A in that special pads are disposed on the lower wiring layer 120 and the upper wiring layer 130, respectively. More specifically, lower pads 124 may be formed on an upper surface of the lower wiring layer 120 on which the penetrating bumps 250 are disposed. Moreover, connection pads 122 may be disposed on a lower surface of the lower wiring layer 120 on which the external connection members 600 are disposed. Upper pads 132 may be disposed on an upper surface of the upper wiring layer 130 on which the upper bumps 350 are disposed.

The lower pads 124, the connection pads 122, and the upper pads 132 may be formed of a metal, such as Al or Cu. However, the material used to form these pads is not limited thereto. The lower pads 124, the connection pads 122, and the upper pads 132 may each be formed of multiple layers or a single layer. For example, the lower pads 124, the connection pads 122, and the upper pads 132 may be formed of Cu by plating or deposition.

Horizontal sectional areas of the lower pads 124, the connection pads 122, and the upper pads 132 may be greater than those of the penetrating bumps 250, the external connection members 600, and the upper bumps 350, respectively, to which the lower pads 124, the connection pads 122, and the upper pads 132 are respectively coupled. However, in some cases, the horizontal sectional areas of the lower pads 124, the connection pads 122, and the upper pads 132 may be equal to or less than those of the penetrating bumps 250, the external connection members 600, and the upper bumps 350, respectively. For example, the lower pads 124 may be formed to conform to the sizes of the horizontal sectional areas of the through holes H1, and thus, the horizontal sectional areas of the lower pads 124 may be substantially the same as those of the penetrating bumps 250.

The lower pads 124, the connection pads 122, and the upper pads 132 may each be formed to have a thickness of about several micrometers (μm), for example, and a width of at most $100*100\,\mu m^2$, for example. However, the sizes of the lower pads 124, the connection pads 122, and the upper pads 132 are not limited thereto. In other words, the lower pads 124, the connection pads 122, and the upper pads 132 may be formed to have various sizes, depending on the sizes of the penetrating bumps 250, the external connection members 600, and the upper bumps 350, to which the lower pads 124, the connection pads 122, and the upper pads 132 are respectively coupled.

Figure 3:
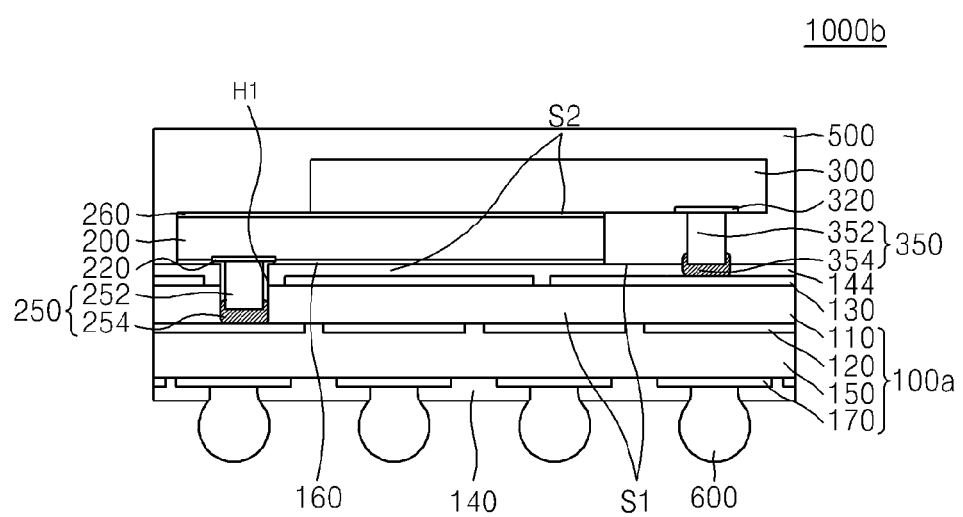

Referring to FIG. 3, the semiconductor package 1000b may be different from the semiconductor package 1000 of FIG. 1A in that a multi-layered substrate 100a includes three wiring layers. More specifically, the multi-layered substrate 100a may include a central insulation layer 110, a first lower wiring layer 120, an upper wiring layer 130, a lower insulation layer 150, and a second lower wiring layer 170. The first lower wiring layer 120 may correspond to the lower wiring layer 120 of the semiconductor package 1000 of FIG. 1A.

The lower insulation layer 150 may be disposed on a lower surface of the first lower wiring layer 120. The lower insulation layer 150 may be formed of, for example, prepreg. Prepreg denotes a sheet obtained by injecting thermohardening resin into an unmolded glass fiber or the like and hardening the unshaped glass fiber with thermohardening resin into B-stage resin (i.e., resin in a semi-hardened state).

The second wiring layer 170 may be disposed on a lower surface of the lower insulation layer 150. The second wiring layer 170 may be formed by attaching a Cu foil onto the lower insulation layer 150 and patterning the Cu foil. The first lower wiring layer 120 and the second lower wiring layer 170 may be electrically connected to each other via an internal wiring (not shown). For example, the internal wiring may penetrate the lower insulation layer 150 to connect the first lower wiring layer 120 with the second lower wiring layer 170.

The second lower wiring layer 170 may also be electrically connected to the upper wiring layer 130 via an internal wiring (not shown). When the second lower wiring layer 170 is connected to the upper wiring layer 130, the internal wiring may be formed to penetrate through the central insulation layer 110, the first lower wiring layer 120, and the lower insulation layer 150. The internal wiring is described in more detail below with reference to FIGS. 20A through 20D.

In contrast with the semiconductor package 1000 of FIG. 1A, the external connection members 600 may penetrate the lower protection layer 142 such as to be physically and/or electrically connected to the second lower wiring layer 170.

Although the multi-layered substrate 100a further includes the lower insulation layer 150 and the second lower wiring layer 170 in the semiconductor package 1000b according to the present embodiment, the structure of the multi-layered substrate 100a is not limited thereto. For example, the multi-layered substrate 100a may include two or more lower insulation layers formed by using prepreg and may also include two or more additional wiring layers formed by coating each of the lower insulation layers with a Cu foil and patterning the Cu foils.

In general, as the number of semiconductor chips stacked in a semiconductor package increases, wiring connections between them are complicated, and the number of wiring layers included in a support substrate, namely, in a multi-layered substrate, may increase. In the semiconductor package 1000b according to the present embodiment, the number of wiring layers included in a multi-layered substrate may be increased to correspond to the number of stacked semiconductor chips so as to cope with a complicated wiring connection.

Figure 4:
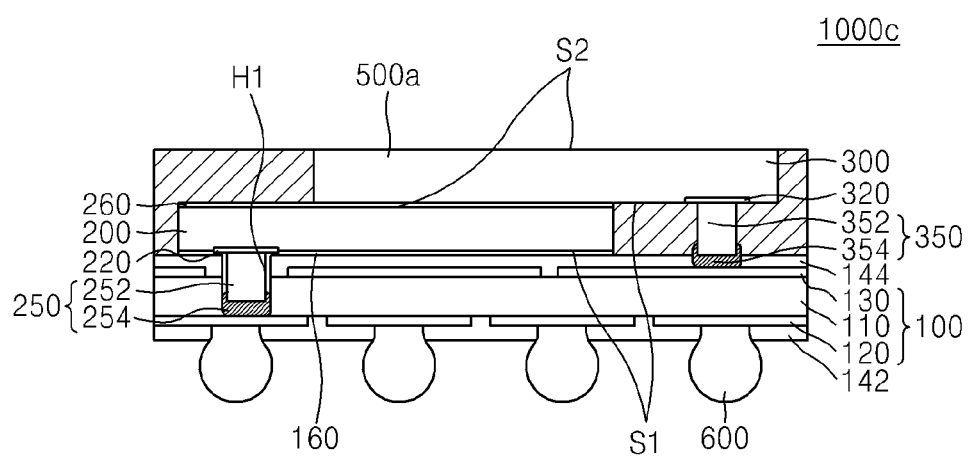

Referring to FIG. 4, the semiconductor package 1000c may be different from the semiconductor package 1000 of FIG. 1A in that a seal 500a seals the first and second semiconductor chips 200 and 300 such that an upper surface, that is, a second surface S2, of the second semiconductor chip 300 is exposed.

For reference, the second surface S2 of the second semiconductor chip 300 may be an inactive surface that is opposite to the first surface S1 of the second semiconductor chip 300 on which the second chip pads 320 are formed, that is, to an active surface. Accordingly, even when the second surface S2 of the second semiconductor chip 300 is exposed to the outside, devices within the second semiconductor chip 300 may not be affected by the outside.

In the semiconductor package 1000c according to the present embodiment, the seal 500a may be formed thinly so that an upper surface of the second semiconductor chip 300 may be exposed. For example, the semiconductor package 1000c may be obtained by forming a seal on lateral surfaces and upper surfaces of the first and second semiconductor chips 200 and 300 and then removing an upper portion of the seal by grinding such that the upper surface of the second semiconductor chip 300 is exposed. As such, the semiconductor package 1000c having the second semiconductor chip 300 whose upper surface is exposed may be entirely very thinly formed due to the small thickness of a seal, and accordingly may contribute to the manufacture of ultra-thin semiconductor packages.

Figure 5:
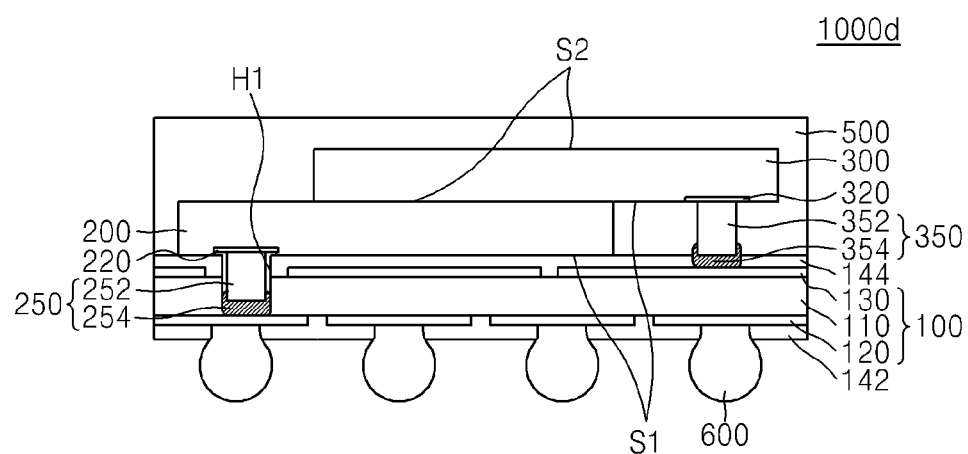

Referring to FIG. 5, the semiconductor package 1000d may be different from the semiconductor package 1000 of FIG. 1A in that no attach media exists between the first semiconductor chip 200 and the multi-layered substrate 100 and between the first semiconductor chip 200 and the second semiconductor chip 300.

In the semiconductor package 1000 of FIG. 1A, the attach medium 160, such as a DAF or a liquid adhesive, is formed on the upper protection layer 144 of the multi-layered substrate 100, and the first semiconductor chip 200 is attached and fixed onto the multi-layered substrate 100 via the attach medium 160. The second semiconductor chip 300 may be attached and fixed to the first semiconductor chip 200 via the attach medium 260.

However, the semiconductor package 1000d according to the present embodiment has no attach mediums. In other words, the first semiconductor chip 200 may be directly stacked on the upper protection layer 144 of the multi-layered substrate 100 without interposing the attach medium 160 between the first semiconductor chip 200 and the upper protection layer 144. The first semiconductor chip 200 may be primarily fixed to the multi-layered substrate 100 due to coupling of the penetrating bumps 250 to the lower wiring layer 120, and may be firmly fixed to the multi-layered substrate 100 due to subsequent sealing by the seal 500.

The second semiconductor chip 300 may also be stacked directly on the first semiconductor chip 200 without interposing the attach medium 260 therebetween. The second semiconductor chip 300 may be primarily fixed to the first semiconductor chip 200 due to coupling of the upper bumps 350 to the upper wiring layer 130, and may be firmly fixed to the first semiconductor chip 200 due to subsequent sealing by the seal 500.

In addition, even when no attach media 260 exist between the first semiconductor chip 200 and the second semiconductor chip 300, the first semiconductor chip 200 and the second semiconductor chip 300 may be coupled to each other by thermal compression due to heat and pressure that are applied during the coupling of the upper bumps 350 and during a molding process for forming a seal.

For reference, even in the semiconductor package 1000 of FIG. 1A, the coupling of the first semiconductor chip 200 to the multi-layered substrate 100 and the coupling of the second semiconductor chip 300 to the first semiconductor chip 200 may become stronger by the combination of the penetrating bumps 250, the combination of the upper bumps 350, and the sealing by the seal.

In the semiconductor package 1000d according to the present embodiment, no attach media 260 exist between the first semiconductor chip 200 and the multi-layered substrate 100 and between the first semiconductor chip 200 and the second semiconductor chip 300, but the attach medium 260 may be formed in one of the spaces between the first semiconductor chip 200 and the multi-layered substrate 100, and between the first semiconductor chip 200 and the second semiconductor chip 300. For example, a DAF that is frequently used may be attached to an upper surface of the first semiconductor chip 200, namely, to the second surface S2 opposite to the first surface S1 on which the first chip pads 220 are formed, and thus the second semiconductor chip 300 may be attached and fixed onto the first semiconductor chip 200 by using the DAF as the attach medium 260.

Figure 6A:
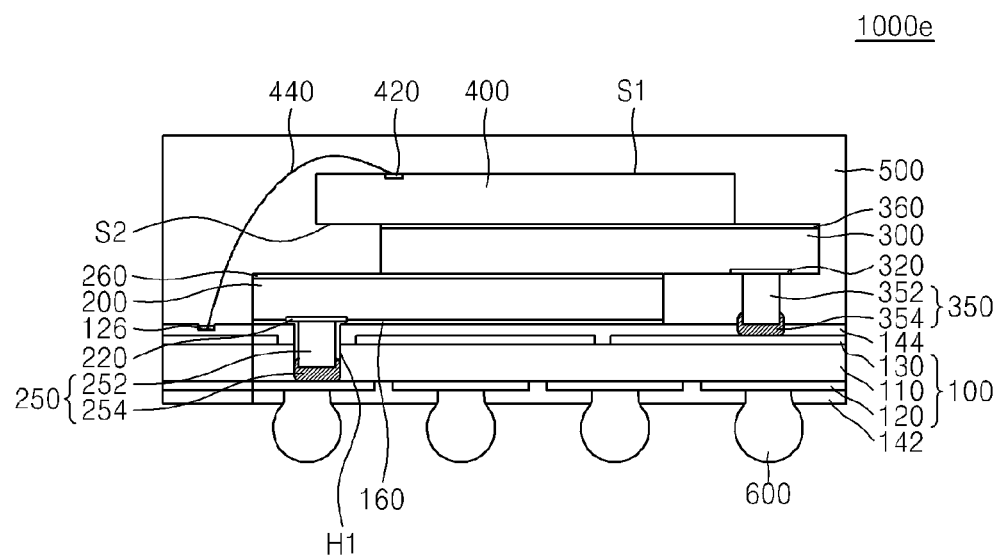
FIGS. 6A through 6C are a cross-sectional view of a semiconductor package in which three semiconductor chips are stacked, according to an embodiment of the inventive concept, and plan views illustrating different stacks of the three semiconductor chips in which the position of chip pads has been reflected.
Figure 6B:
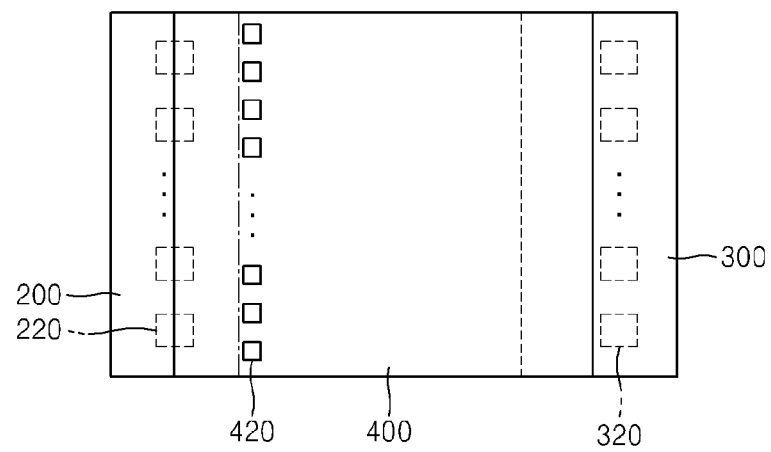
Figure 6C:
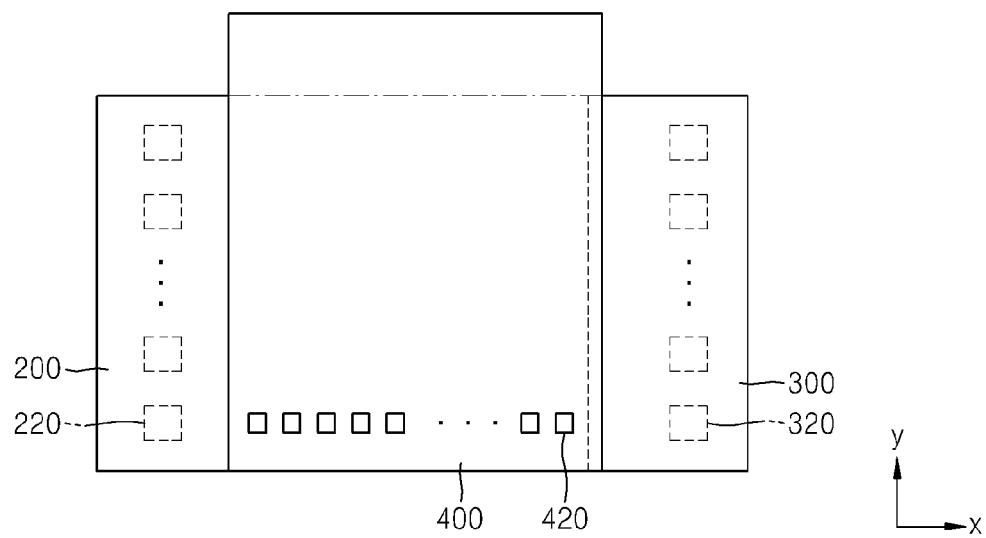

FIGS. 6A through 6C are a cross-sectional view of a semiconductor package 1000e in which three semiconductor chips, namely, first, second, and third semiconductor chips 200, 300, and 400, respectively, are stacked, according to an embodiment of the inventive concept, and plan views illustrating different stacks of the three semiconductor chips in which the locations of chip pads have been reflected. For convenience of explanation, matters described above with reference to FIGS. 1A through 5 are briefly described, or otherwise not repeated herein.

Referring to FIG. 6A, the semiconductor package 1000e may include the first, second, and third semiconductor chips 200, 300, and 400, respectively, in contrast with the semiconductor package 1000 of FIG. 1A. More specifically, the semiconductor package 1000e may include a multi-layered substrate 100, a first semiconductor chip 200, a second semiconductor chip 300, a third semiconductor chip 400, a seal 500, and an external connection members 600.

The first semiconductor chip 200, the second semiconductor chip 300, the seal 500, and the external connection members 600 may be the same or substantially the same as those of the semiconductor package 1000 of FIG. 1A. However, the seal 500 may seal the first, second, and third semiconductor chips 200, 300, and 400.

Referring to FIG. 6A, the multi-layered substrate 100 may include two wiring layers, namely, a lower wiring layer 120 and an upper wiring layer 130. However, the multi-layered substrate 100 may include three wiring layers as in the semiconductor package 1000b of FIG. 3. Alternatively, the multi-layered substrate 100 may include three wiring layers by forming an internal wiring layer (not shown) within a central insulation layer 110.

The third semiconductor chip 400 may be a memory chip or a non-memory chip, like the first semiconductor chip 200 or the second semiconductor chip 300. In some cases, the first and second semiconductor chips 200 and 300 may be memory chips, and the third semiconductor chip 400 may be a non-memory chip.

The third semiconductor chip 400 may be connected to the multi-layered substrate 100 by wire bonding. Accordingly, third chip pads 420 of the third semiconductor chip 400 may be connected to bonding pads 126 of the multi-layered substrate 100 via metal wires 440. The metal wires 440 may be formed of, for example, Au, Al, or Cu.

Because the third semiconductor chip 400 is connected to the multi-layered substrate 100 by wire bonding, the third semiconductor chip 400 may be stacked on the second semiconductor chip 300 such that the first surface S1 of the third semiconductor chip 400 on which the third chip pads 420 are formed faces upward. In other words, the third semiconductor chip 400 may be stacked on the second semiconductor chip 300 such that a second surface S2 that is an inactive surface opposite to the first surface S1 is attached and fixed to the second semiconductor chip 300 via an attach medium 360.

The third semiconductor chip 400 may be stacked on the second semiconductor chip 300 to have an offset structure in which the third semiconductor chip 400 protrudes leftward from the second semiconductor chip 300. The degree of protrusion of the third semiconductor chip 400 with respect to the second semiconductor chip 300 may be less than the protrusion of the first semiconductor chip 200. If the third semiconductor chip 400 protrudes more than the first semiconductor chip 200, a larger space for wire bonding may be required. However, the third semiconductor chip 400 may protrude more than the first semiconductor chip 200. The third semiconductor chip 400 may be stacked on the second semiconductor chip 300 in other various structures, which is described later in greater detail below with reference to FIGS. 6B and 6C.

For wire bonding with the third semiconductor chip 400, the bonding pads 126 may be formed on the upper wiring layer 130. The bonding pads 126 may be formed of a metal and may be electrically to the upper wiring layer 130. The bonding pads 126 may be connected to the external connection members 600 via an internal wiring (not shown) connected with the upper wiring layer 130 and the lower wiring layer 120, and thus may electrically connect the third semiconductor chip 400 to the external connection members 600.

In the semiconductor package 1000e according to the present embodiment, the third semiconductor chip 400 may be further stacked by wire bonding, and accordingly, a large-capacity semiconductor package may be obtained. In the semiconductor package 1000e according to the present embodiment, a single semiconductor chip, for example, only the third semiconductor chip 400, is stacked on the second semiconductor chip 300 by wire bonding, but at least two semiconductor chips may be stacked by wire bonding. When two or more semiconductor chips are stacked by wire bonding, the semiconductor chips may be stacked in any of various structures, such as, a zigzag structure or a stepped structure, in order to minimize a space necessary for wire bonding.

Referring to FIG. 6B, the first, second, and third semiconductor chips 200, 300, and 400 may be stacked in a zigzag structure. In other words, the first semiconductor chip 200 and the third semiconductor chip 400 may protrude leftward with respect to the second semiconductor chip 300. As described above, the third semiconductor chip 400 may protrude less from the second semiconductor chip 300 than the first semiconductor chip 200 protrudes. In FIG. 6B, a dotted straight line indicates a right side of the first semiconductor chip 200, and a one-dot dashed straight line indicates a left side of the second semiconductor chip 300.

The third chip pads 420 of the third semiconductor chip 400 may be arranged along a left side of the third semiconductor chip 400, similar to the first chip pads 220 of the first semiconductor chip 200. As illustrated in FIG. 6B, the third chip pads 420 may be smaller than the first chip pads 220 or the second chip pads 320. However, the size of the third chip pads 420 is not limited thereto. For example, the size of the third chip pads 420 may be equal to or greater than that of the first chip pads 220 or the second chip pads 320.

Same numbers of first chip pads 220, second chip pads 320, and third chip pads 420 may be formed. Alternatively, at least one of the numbers of first chip pads 220, second chip pads 320, and third chip pads 420 formed may be different from the others. For example, the numbers of first chip pads 220, second chip pads 320, and third chip pads 420 may vary according to the numbers or functions of devices respectively formed within the first, second, and third semiconductor chips, respectively. Accordingly, the same numbers of chip pads may be included in the same chips, and different numbers of chip pads may be included in different chips.

Referring to FIG. 6C, in contrast with the semiconductor chip stacking structure of the semiconductor package 1000e of FIG. 6B, the first, second, and third semiconductor chips 200, 300, and 400 according to the present embodiment may be stacked in such a way that a longer axis of the third semiconductor chip 400 is perpendicular to that of the first semiconductor chip 200 or the second semiconductor chip 300. In other words, in the semiconductor package 1000e of FIG. 6B, the first, second, and third semiconductor chips 200, 300, and 400 may be stacked such that their long axes are parallel to one another. However, in the present embodiment, the longer axes of the first and second semiconductor chips 200 and 300 may be parallel to an x direction, whereas the longer axis of the third semiconductor chip 400 may be parallel to a y direction.

In FIG. 6C, a dotted straight line indicates a right side of the first semiconductor chip 200. A left side of the second semiconductor chip 300 may be consistent with, aligned with, and/or flush with a left side of the third semiconductor chip 400. However, the left side of the second semiconductor chip 300 need not be consistent with, aligned with, and/or flush with the left side of the third semiconductor chip 400.

The longer axis of the third semiconductor chip 400 can be orientated in a different direction from the directions of the longer axes of the first and second semiconductor chips 200 and 300, and thus the third chip pads 420 of the third semiconductor chip 400 may be arranged along a lower side thereof in the y direction. The third chip pads 420 may be arranged appropriately in consideration of a wire bonding space. For example, the third chip pads 420 may be arranged along an upper side of the third semiconductor chip 400 in the y direction.

In FIG. 6C, the lower side of the third semiconductor chip 400 may be consistent with, aligned with, and/or flush with a lateral side of the first semiconductor chip 200 or the second semiconductor chip 300. However, the lower side of the third semiconductor chip 400 need not be consistent with, aligned with, and/or flush with the lateral side of the first semiconductor chip 200 or the second semiconductor chip 300. For example, the lower side of the third semiconductor chip 400 may protrude downward such that the third semiconductor chip 400 may protrude both upward and downward from the first and second semiconductor chips 200 and 300.

As described above, in the semiconductor chip stacking structure according to the present embodiment, the third semiconductor chip 400 may be disposed such that its longer axis is perpendicular to those of the first and second semiconductor chips 200 and 300. However, the longer axis of the third semiconductor chip 400 may intersect with those of the first and second semiconductor chips 200 and 300 at an acute angle.

Figure 7:
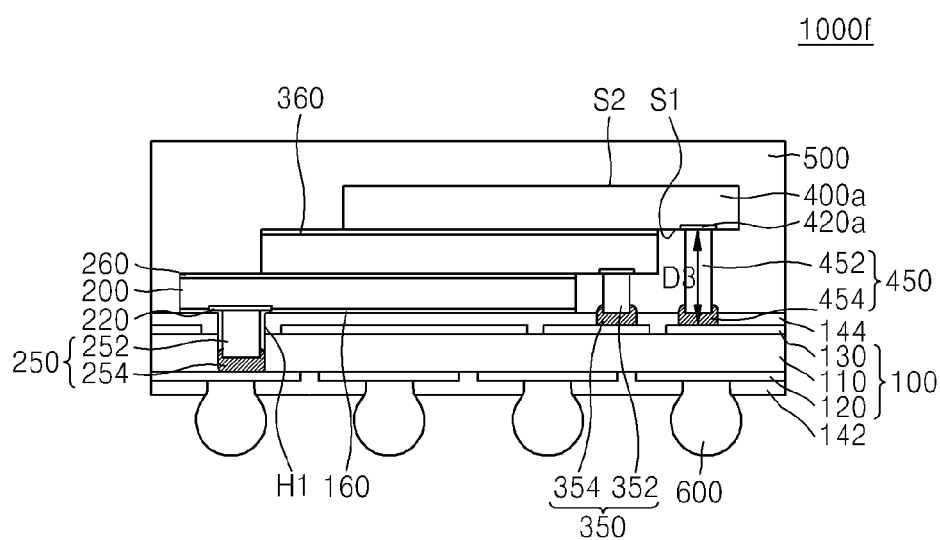
FIGS. 7 and 8 are cross-sectional views of semiconductor packages in each of which three semiconductor chips are stacked, according to embodiments of the inventive concept.
Figure 8:
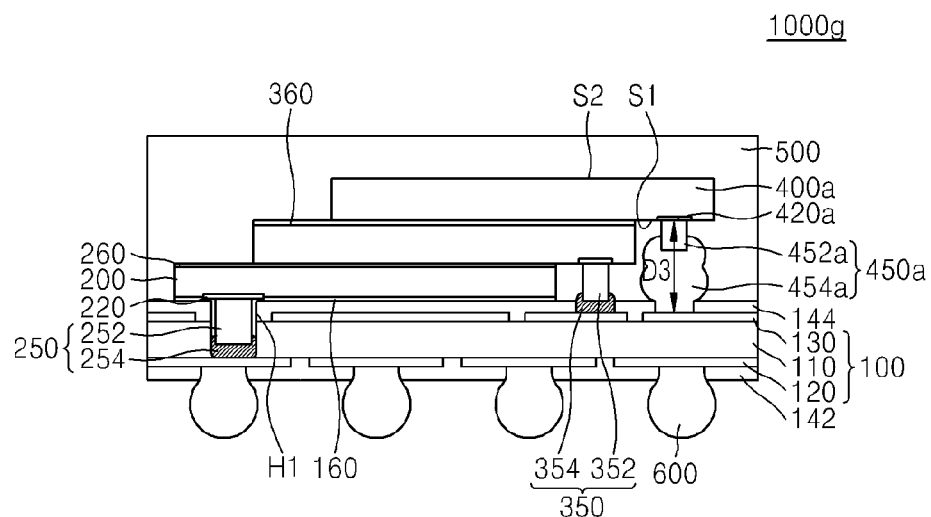

FIGS. 7 and 8 are cross-sectional views of semiconductor packages 1000f and 1000g in each of which three semiconductor chips are stacked, according to embodiments of the inventive concept. For convenience of explanation, matters described above with reference to FIGS. 1A through 6C are briefly described, or otherwise not repeated herein.

Referring to FIG. 7, the semiconductor package 1000f may be different from the semiconductor package 1000e of FIG. 6A in that a third semiconductor chip 400a is connected to a multi-layered substrate 100 by flip-chip bonding. More specifically, the third semiconductor chip 400a may be stacked on the second semiconductor chip 300 via an attach medium 360 such that a first surface S1 of the third semiconductor chip 400a on which third chip pads 420a are formed faces the multi-layered substrate 100. The third chip pads 420a of the third semiconductor chip 400a may be connected to the upper wiring layer 130 via medium bumps 450.

Each medium bump 450 may include a metal pillar 452 and a solder 454. The metal pillar 452 and the solder 454 of the medium bump 450 may be the same as or substantially the same as the metal pillar 352 and the solder 354 of the upper bump 350 of the semiconductor package 1000 of FIG. 1A. However, each of the medium bumps 450 may have a third thickness D3 corresponding to a sum of the thicknesses of the first semiconductor chip 200 and the second semiconductor chip 300, and thus, the medium bumps 450 may directly connect the third chip pads 420a to the upper wiring layer 130.

To make the third thickness D3 of each medium bump 450 be equal to the sum of the thicknesses of the first semiconductor chip 200 and the second semiconductor chip 300, the metal pillar 452 may be thicker compared with the metal pillar 252 of each penetrating bump 250 or the metal pillar 352 of each upper bump 350. The metal pillar 452 of the medium bump 450 may be formed thickly by deposition. Plating is not excluded.

In the semiconductor package 1000f according to the present embodiment, the third semiconductor chip 400a may be connected to the multi-layered substrate 100 by flip-chip bonding, similar to the first and second semiconductor chips 200 and 300. Accordingly, a space for wire bonding is not necessary, and thus the semiconductor package 1000f may have a small size. In the semiconductor package 1000f according to the present embodiment, a single semiconductor chip, namely, only the third semiconductor chip 400a, may be further stacked, but at least two semiconductor chips may be further stacked. To stack the two or more additional semiconductor chips, wire bonding may also be used together with flip-chip bonding.

In the semiconductor package 1000f according to the present embodiment, the first, second, and third semiconductor chips 200 300, and 400a are stacked such that their longer axes are parallel to one another. However, the longer axis of the third semiconductor chip 400a may be perpendicular to those of the first and second semiconductor chips 200 and 300, as shown in FIG. 6C. When two or more additional semiconductor chips are stacked in a semiconductor package, they may be stacked with longer axes having appropriate directions and with appropriate degrees of protrusions by considering the entire size of the semiconductor package.

Referring to FIG. 8, the semiconductor package 1000g may be different from the semiconductor package 1000f of FIG. 7 in that a medium bump 450a includes a dual solder 454a. More specifically, the medium bump 450a may include a metal pillar 452a and the dual solder 454a. The dual solder 454a may be a stack of two solders. The dual solder 454a may be formed by combining an initial solder formed on the metal pillar 452a with an upper solder formed on the upper wiring layer 130 during flip-chip bonding. However, a prepared dual solder 454a may be formed on the metal pillar 452a.

The thickness of the dual solder 454a may be almost twice the thickness of the solder 454 of the medium bump 450 of the semiconductor package 1000f of FIG. 7. Accordingly, the metal pillar 452a of the medium bump 450a may be formed to have a smaller thickness compared with the metal pillar 452 of the medium bump 450 of the semiconductor package 1000f of FIG. 7. The entire thickness of the medium bump 450a may be equal to the third thickness D3, which is the thickness of the medium bump 450 of the semiconductor package 1000f of FIG. 7.

The number of additional semiconductor chips stacked on the second semiconductor chip 300, a stacking direction of the additional semiconductor chips, mixing of wire bonding with flip-chip bonding, and the like may be the same as or substantially the same as those for the semiconductor package 1000f of FIG. 7.

Figure 9A:
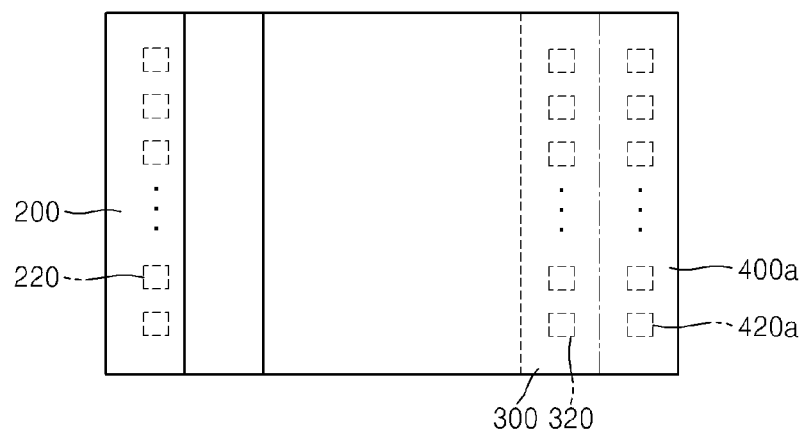
FIGS. 9A and 9B are plan views illustrating different stacks of three semiconductor chips in which the position of chip pads has been reflected, in the semiconductor package of FIG. 7 or 8.
Figure 9B:
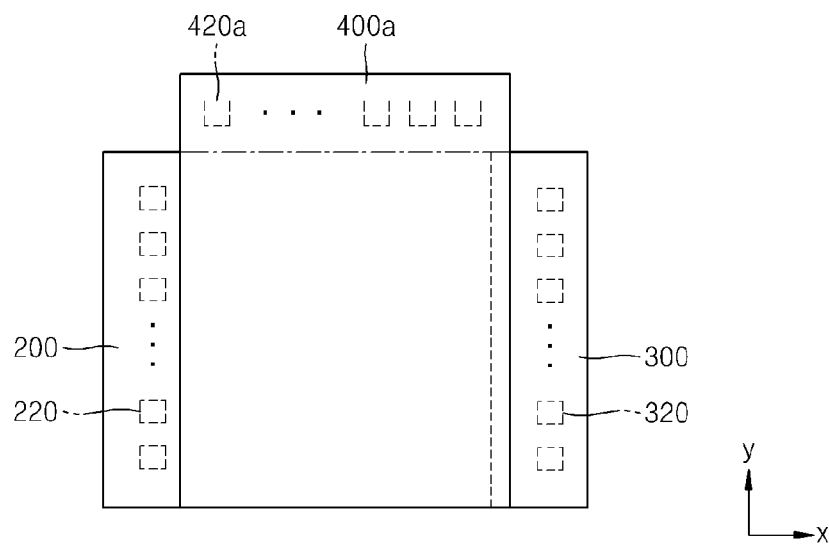

FIGS. 9A and 9B are plan views illustrating different stacks of the first, second, and third semiconductor chips 200, 300, and 400a in which the locations of chip pads have been reflected, in the semiconductor package 100f or 100g of FIG. 7 or 8. For convenience of explanation, matters described above with reference to FIG. 7 or 8 are briefly described, or otherwise not repeated herein.

Referring to FIG. 9A, the first, second, and third semiconductor chips 200, 300, and 400a in the semiconductor package 1000f or 1000g of FIG. 7 or 8 may be stacked in a stepped structure in such a way that their longer axes are parallel to one another. Accordingly, the second semiconductor chip 300 may be positioned in the middle, the first semiconductor chip 200 may protrude leftward from the second semiconductor chip 300, and the third semiconductor chip 400 may protrude rightward from the second semiconductor chip 300. In FIG. 9A, a dotted straight line indicates a right side of the first semiconductor chip 200, and a one-dot dashed straight line indicates a right side of the second semiconductor chip 300.

The first, second, and third chip pads 220, 320, and 420a of the first, second, and third semiconductor chips 200, 300, and 400a, respectively, may be the same as or substantially the same as each other in terms of the sizes of chip pads and the number of chip pads arranged. However, the sizes of the first, second, and third chip pads 220, 320, and 420s or the numbers of first, second, and third chip pads 220, 320, and 420a may vary depending on the numbers or functions of devices respectively formed within the first, second, and third semiconductor chips 200, 300, and 400a, respectively. For example, the number of at least one of the first, second, and third chip pads 220, 320, and 420a may be different from the numbers of the other chip pads, or the size of at least one of the first, second, and third chip pads 220, 320, and 420a may be different from the sizes of the other chip pads.

The first chip pads 220 may be arranged along a left side of the first semiconductor chip 200, the second chip pads 320 may be arranged along the right side of the second semiconductor chip 300, and the third chip pad 420a may be arranged along the right side of the third semiconductor chip 400a. The second and third chip pads 320 and 420a can be arranged on exposed portions of the right side surfaces of the second and third semiconductor chips 300 and 400 in order to achieve flip-chip bonding with the multi-layered substrate 100. However, the arrangement of the first chip pads 220 is not limited to the arrangement on the left side of the first semiconductor chip 200. For example, the arrangement location of the first chip pads 220 may vary according to the locations of the through holes H1 formed in the multi-layered substrate 100.

Referring to FIG. 9B, in contrast with the semiconductor chip stacking structure of FIG. 9A, the longer axis of the third semiconductor chip 400a may be perpendicular to those of the first and second semiconductor chips 200 and 300. In other words, the longer axes of the first and second semiconductor chips 200 and 300 may be orientated in the x direction, and the longer axis of the third semiconductor chip 400a may be orientated in the y direction. Accordingly, the semiconductor chip stacking structure according to the present embodiment may be similar to that of FIG. 6C.

In the semiconductor chip stacking structure of FIG. 6C, the third semiconductor chip 400 is stacked such that it's first surface S1 having the third chip pads 420 formed thereon faces upward. However, in the present embodiment, the third semiconductor chip 400a may be stacked such that its first surface S1 faces the multi-layered substrate 100. Accordingly, in contrast with the third semiconductor chip 400 of FIG. 6C, in the present embodiment, the third chip pads 420a are indicated by small rectangles surrounded by dotted lines. In FIG. 9B, a dotted straight line indicates a right side of the first semiconductor chip 200.

As in the semiconductor chip stacking structure according to the present embodiment, the longer axis of the third semiconductor chip 400a is perpendicular to the longer axes of the first and second semiconductor chips 200 and 300 in order to increase the space utilization of the semiconductor package 1000f or 1000g, thereby leading to a semiconductor package with a reduced size. Considering the fact that the third semiconductor chip 400a is also stacked by flip-chip bonding, one side of the third semiconductor chip 400a needs to protrude, and the third chip pads 420a can be arranged on the protruding portion. For example, in the present embodiment, the third chip pads 420a may be arranged along a protruding portion of an upper side of the third semiconductor chip 400a in the y direction. As described above with respect to the semiconductor chip stacking structure of FIG. 6C, the angle at which the longer axis of third semiconductor chip 400a intersects with those of the first and second semiconductor chips 200 and 300 is not limited to a right angle but may be an acute angle.

Figure 10A:
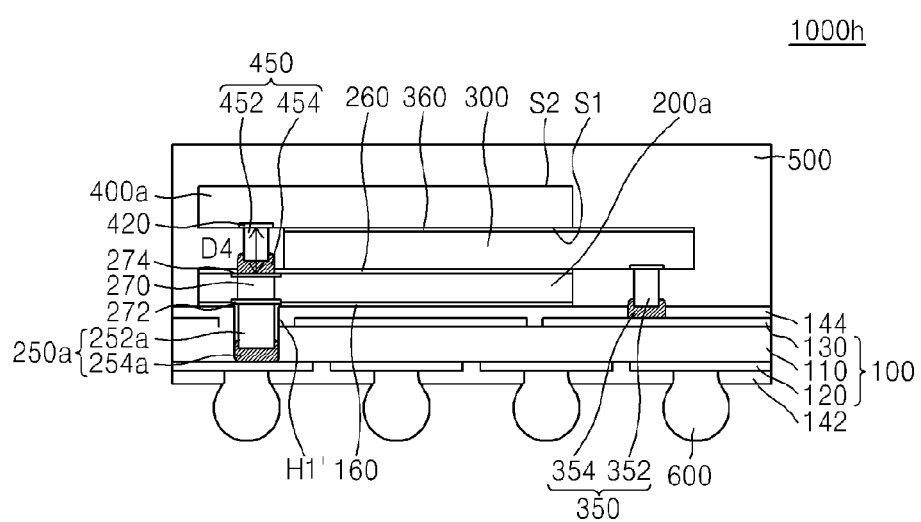
FIGS. 10A through 10C are a cross-sectional view of a semiconductor package in which three semiconductor chips are stacked, according to an embodiment of the inventive concept, and plan views illustrating relationships between chip pads and through silicon vias (TSV)s.
Figure 10B:
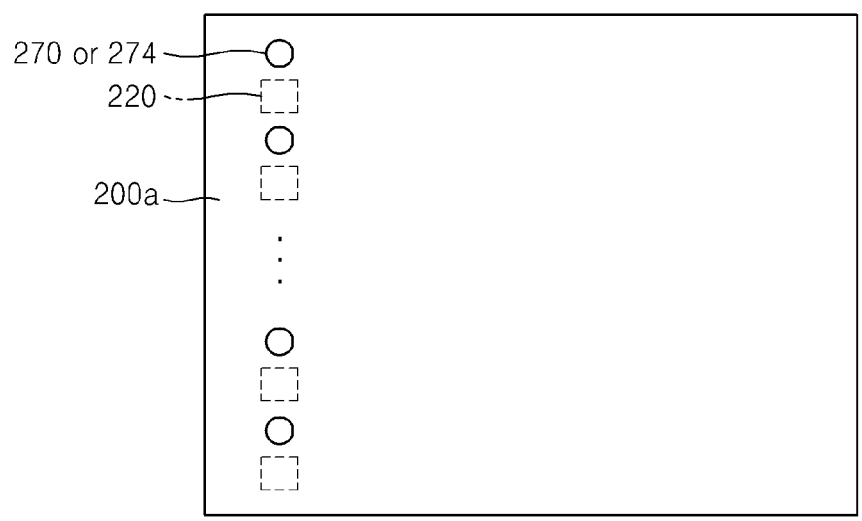
Figure 10C:
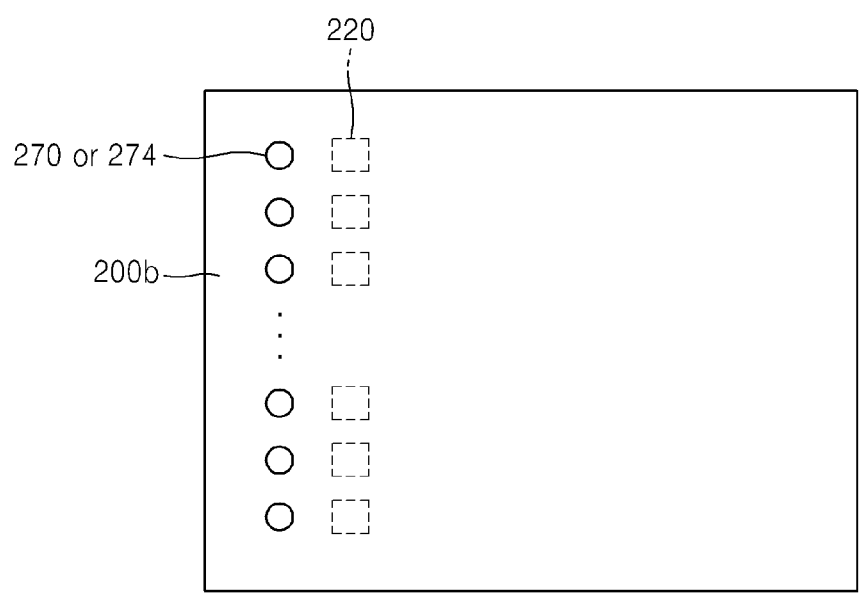

FIGS. 10A through 10C are a cross-sectional view of a semiconductor package 1000h in which three semiconductor chips are stacked, according to an embodiment of the inventive concept, and plan views illustrating relationships between the positions of chip pads and TSVs of the semiconductor package 1000h. For convenience of explanation, matters described above with reference to FIGS. 1A through 9B are briefly described, or otherwise not repeated herein.

Referring to FIG. 10A, the semiconductor package 1000h according to the present embodiment, the third semiconductor chip 400a may be connected by flip-chip bonding but may have a different structure from that in the semiconductor package 1000f or 1000g of FIG. 7 or 8. In the semiconductor package 1000h according to the present embodiment, the third semiconductor chip 400a may be connected to the multi-layered substrate 100 via TSVs 270 formed in a first semiconductor chip 200a.

More specifically, the first semiconductor chip 200a may have a plurality of TSVs 270 formed along one side surface, for example, a left side surface, thereof. Lower and upper surface pads 272 and 274 may be formed on lower and upper surfaces of the TSVs 270, respectively. The third semiconductor chip 400a may be stacked to protrude leftward from a second semiconductor chip 300, and third chip pads 420 may be arranged along a left side surface of the third semiconductor chip 400a such as to face the TSVs 270. Accordingly, the third chip pads 420 may be connected to the upper surface pads 274 of the TSVs 270 via medium bumps 450 by flip-chip bonding.

As in the semiconductor package 1000f or 1000g of FIG. 7 or 8, each medium bump 450 may include a metal pillar 452 and a solder 454. However, the medium bump 450 may have a fourth thickness D4 corresponding to the thickness of the second semiconductor chip 300. When the first semiconductor chip 200a and the second semiconductor chip 300 have the same thickness, the thickness of the medium bump 450 may be almost the same as or substantially the same as that of the upper bump 350.

A plurality of through holes H1' may be formed in the multi-layered substrate 100 such as to face the TSVs 270, and the TSVs 270 may be connected to penetrating bumps 250a disposed within the through holes H1'. Similarly, each penetrating bump 250a may include a metal pillar 252a and a solder 254a. A material, a size, or the like of the penetrating bump 250a may be the same as or substantially the same as that of the penetrating bump 250 of the semiconductor package 1000 of FIG. 1A.

Although not shown, first chip pads 220 of the first semiconductor chip 200a may be arranged around the TSVs 270, and penetrating bumps 250 connected to the first chip pads 220 may be arranged around the penetrating bumps 250a connected to the TSVs 270. The arrangement locations of the first chip pads 220 and the TSVs 270 is described below in greater detail with reference to FIGS. 10B and 10C.

In the semiconductor package 1000h according to the present embodiment, the third semiconductor chip 400a may be connected to the multi-layered substrate 100 via the TSVs 270 formed in the first semiconductor chip 200a, by flip-chip bonding. The third semiconductor chip 400a protrudes leftward from the second semiconductor chip 300 such that the third semiconductor chip 400a may be vertically aligned with the first semiconductor chip 200a. Accordingly, a horizontal cross-sectional area of the semiconductor package 1000h may be almost the same as or substantially the same as that of the semiconductor package 1000a of FIG. 1A. Therefore, the semiconductor package 1000h according to the present embodiment may have a large capacity and may greatly contribute to a reduction in the semiconductor package size.

Referring to FIG. 10B, both the TSVs 270 and the first chip pads 220 may be formed in the first semiconductor chip 200a. In FIG. 10B, solid line circles indicate the TSVs 270 or the upper surface pads 274 exposed via the upper surface of the first semiconductor chip 200a, and dotted line rectangles indicate the first chip pads 220 disposed on the lower surface of the first semiconductor chip 200a. In the present embodiment, the TSVs 270 and the first chip pads 220 may be arranged along one side surface of the first semiconductor chip 200a, for example, along a left side surface thereof, and the TSVs 270 and the first chip pads 220 may alternate.

However, this arrangement may be suitable when relatively small numbers of third chip pads 420 and first chip pads 220 are disposed on the third semiconductor chip 400a and the first semiconductor chip 200a, respectively. When large numbers of third chip pads 420 and first chip pads 220 are to be formed, it is more difficult to arrange the TSVs 270 and the first chip pads 220 in a line. Accordingly, when large numbers of third chip pads 420 and first chip pads 220 are to be formed, an arrangement of FIG. 10C may be used.

Referring to FIG. 10C, TSVs 270, and first chip pads 220 according to the present embodiment may be arranged on a first semiconductor chip 200b in their respective lines. Although the number of the TSVs 270s may be the same as that of the first chip pads 220s and the interval between the TSVs 270s may be the same as that between the first chip pads 220s in FIG. 10C, the numbers of TSVs 270 and first chip pads 220 arranged or the arrangement locations thereof are not limited thereto. For example, the numbers of TSVs 270 and first chip pads 220 to be arranged may be different, and the arrangement locations and intervals thereof may be different.

The TSVs 270 are arranged along the left side surface of the first semiconductor chip 200b according to the arrangement location of the third chip pads 420 of the third semiconductor chip 400a, but the arrangement location of the first chip pads 220 on the first semiconductor chip 200b is not limited to the left side of the first semiconductor chip 200b. In other words, the first chip pads 220 may be arranged at any portion of the first semiconductor chip 200b as long as the arrangement location of the through holes H1 of the multi-layered substrate 100 is not limited. For example, the first chip pads 220 may be arranged along a center portion of the first semiconductor chip 200b, or along an upper and/or lower side of the first semiconductor chip 200b. Alternatively, the first chip pads 220 may be arranged along the right side of the first semiconductor chip 200b. That is, the first chip pads 220 may be arranged along a side of the first semiconductor chip 200b that is opposite to the side along which the penetrating electrodes 270 are arranged.

In the semiconductor package 1000h according to the present embodiment, the arrangement locations of the TSVs 270 and the first chip pads 220 formed in the first semiconductor chip 200a may be determined appropriately in consideration of the locations and functions of the devices included in the third semiconductor chip 400a and the first semiconductor chip 200a.

FIGS. 11 through 15 are cross-sectional views of semiconductor packages 2000, 2000a, 2000b, 2000c, and 2000d according to embodiments of the inventive concept. For convenience of explanation, matters described above with reference to FIGS. 1A through 10C are briefly described, or otherwise not repeated herein.

Figure 11:
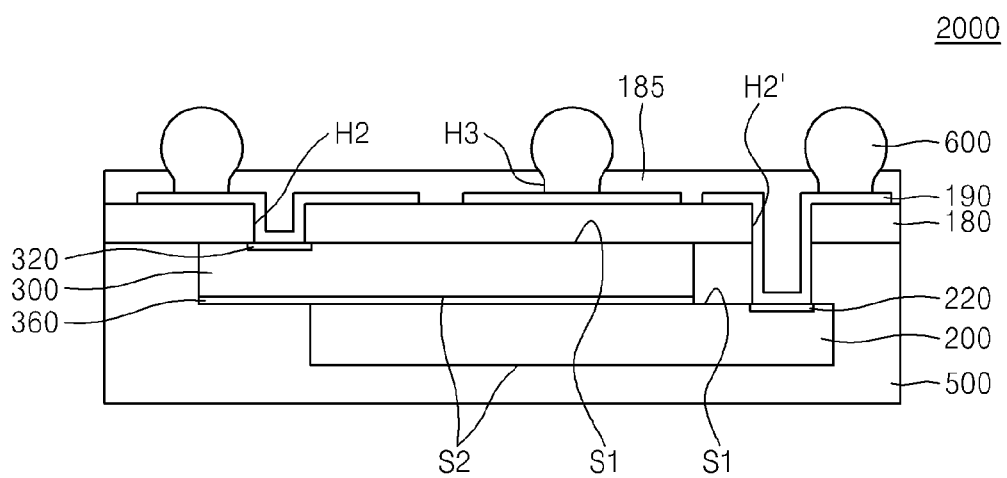
FIGS. 11 through 15 are cross-sectional views of semiconductor packages according to embodiments of the inventive concept.

Referring to FIG. 11, the semiconductor package 2000 according to the present embodiment may include a first semiconductor chip 200, a second semiconductor chip 300, an upper insulation layer 180, a protection layer 185, a wiring layer 190, a seal 500, and external connection members 600.

The types or characteristics of the first semiconductor chip 200 and the second semiconductor chip 300 may be the same as or substantially the same as those of the semiconductor package 1000 of FIG. 1A. The direction in which the first semiconductor chip 200 and the second semiconductor chip 300 are stacked may be different from that in the semiconductor package 1000 of FIG. 1A. More specifically, the first semiconductor chip 200 may be disposed such that its first surface S1 on which first chip pads 220 are formed faces upward, and the second semiconductor chip 300 may be stacked on the first surface S1 of the first semiconductor chip 200. Similarly, the second semiconductor chip 300 may be stacked on the first semiconductor chip 200 such that a first surface S1 of the second semiconductor chip 300 on which second chip pads 320 are formed faces upward. In other words, the second semiconductor chip 300 may be stacked on the first semiconductor chip 200 such that the second surface S2 of the second semiconductor chip 300 is attached and fixed onto the first surface S1 of the first semiconductor chip 200 via an attach medium 360.

The material and the like of the seal 500 may be the same as or substantially the same as those in the semiconductor package 1000 of FIG. 1A. However, since the first semiconductor chip 200 and the second semiconductor chip 300 are not stacked on a support member such as a multi-layered substrate, the seal 500 seals only the lateral sides and second surfaces of the first semiconductor chip 200 and the second semiconductor chip 300, without covering a support member. Instead, the upper surface of the seal 500 may contact the upper insulation layer 180.

The upper insulation layer 180 may be formed on the first surface S1 of the second semiconductor chip 300 and the upper surface of the seal 500. The upper insulation layer 180 may be formed of an insulation material and thus may protect the first surface S1 of the second semiconductor chip 300 from external physical and/or chemical damages. For example, the upper insulation layer 180 may be formed of an oxide layer, a nitride layer, or a double layer formed of an oxide layer and a nitride layer. The upper insulation layer 180 may be formed of an oxide layer, for example, a silicon oxide ($SiO_2$) layer, by high-density plasma chemical vapor deposition (HDP-CVD).

A plurality of holes H2 may be formed in the upper insulation layer 180 in order to expose second chip pads 320 of the second semiconductor chip 300. A plurality of holes H2' may also be formed to expose first chip pads 220 of the first semiconductor chip 200. A hole that penetrates the upper insulation layer 180 and a hole that penetrates the seal 500 may constitute a hole H2'. The upper insulation layer 180 may expose the second chip pads 320 of the second semiconductor chip 300 via the holes H2 and the first chip pads 220 of the first semiconductor chip 200 via the holes H2', wherein the first and second chip pads 220 and 320 have buried structures.

In some cases, a special protection layer (not shown) may be formed on the first surface S1 of the second semiconductor chip 300 and/or the first semiconductor chip 200, and the protection layer may expose the second chip pads 320 and the first chip pads 220 having buried structures. When special protection layers are respectively formed on the second semiconductor chip 300 and the first semiconductor chip 200, the upper insulation layer 180 may be omitted.

A wiring layer 190 may be formed on the upper insulation layer 180. More specifically, the wiring layer 190 may be formed on lateral surfaces and bottom surfaces of the holes H2 and H2' formed within the upper insulation layer 180. The wiring layer 190 may extend along the upper surface of the upper insulation layer 180. When the wiring layer 190 is thick, the holes H2 and H2' may be completely filled with the wiring layer 190. The wiring layer 190 may be electrically and/or physically connected to the first chip pads 220 of the first semiconductor chip 200 and the second chip pads 320 of the second semiconductor chip 300.

Although it is illustrated in FIG. 11 that a middle portion of the wiring layer 190 is not connected to chip pads due to the characteristics of the cross-section, an inwardly extended portion of the wiring layer 190 may be connected to chip pads. When the upper insulation layer 180 is not included, the wiring layer 190 may extend from the chip pads to the upper surface of the seal 500. For example, when a special protection layer is formed on the first surface S1 of the second semiconductor chip 300 as described above, the wiring layer 190 may extend from the chip pads to the upper surface of the seal 500 through the protection layer.

The protection layer 185 may be formed on the wiring layer 190 and the upper insulation layer 180, and may include a plurality of holes H3 exposing a portion of the wiring layer 190. The protection layer 185 may be formed of SR or DFR, for example. A general insulation layer, such as an oxide layer or a nitride layer, is not excluded. The external connection members 600 may be disposed in the holes H3 of the protection layer 185 and thus may be physically and/or electrically connected to the wiring layer 190. The external connection members 600 may be the same as or substantially the same as those described above with respect to the semiconductor package 1000 of FIG. 1A.

The semiconductor package 2000 according to the present embodiment may have a package structure formed of only semiconductor chips without a supporting substrate. The semiconductor package 2000 according to the present embodiment may have a fan-out structure in which a semiconductor package is larger than a semiconductor chip. Semiconductor packages including no supporting substrates may be roughly classified into a fan-in package and a fan-out package. A fan-in package may denote a package having the same size as the size of a semiconductor chip due to arrangement of external connection members, such as solder balls, only within corresponding portions of the first surface of the semiconductor chip. On the other hand, a fan-out package may denote a package that is larger than a semiconductor chip due to arrangement of external connection members on the wiring layer 190 extending outward from the first surface of the semiconductor chip, as in the semiconductor package 2000 according to the present embodiment.

The semiconductor package 2000 according to the present embodiment may have a fan-out structure by stacking two semiconductor chips in an offset structure and arranging external connection members by using buried pads and wiring layers according to the offset structure. Semiconductor packages having a fan-out structure generally include a single semiconductor chip. However, the semiconductor package 2000 according to the present embodiment may have a fan-out structure in which 2 semiconductor chips are stacked.

Accordingly, the semiconductor package 2000 according to the present embodiment may be realized as a multi-layered semiconductor package with a fan-out structure at a low cost via a simple and easy process with a small form factor. The semiconductor package 2000 according to the present embodiment is able to operate fast due to the characteristics of a wiring structure, and can satisfy a need for large capacity due to a structure in which a plurality of semiconductor chips are stacked.

Figure 12:
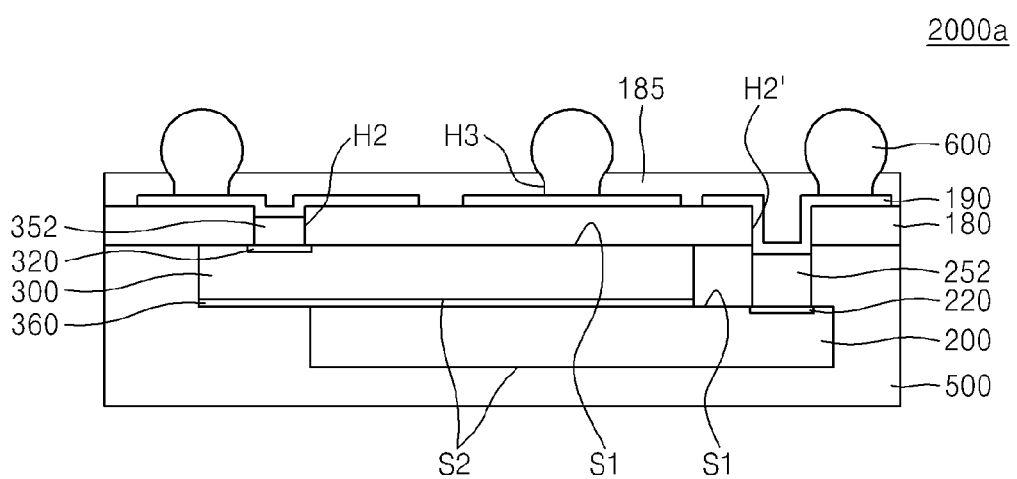

Referring to FIG. 12, the semiconductor package 2000c according to the present embodiment may be different from the semiconductor package 2000 of FIG. 11 in that protruding pads 252 and 352 are formed on first chip pads 220 of the first semiconductor chip 200 and second chip pads 320 of the second semiconductor chip 300, respectively. In other words, the protruding pads 252 and 352 having filler structures may be respectively formed on the first chip pads 220 and the second chip pads 320, and the use of the protruding pads 252 and 352 may reduce the depth by which the wiring layer 190 penetrates the upper insulation layer 180 and/or the seal 500.

In particular, since the first chip pads 220 of the first semiconductor chip 200 are relatively far from the upper surface of the upper insulation layer 180, it may difficult to form the wiring layer 190, and accordingly, wiring failure such as contact failure may occur. However, as in the present embodiment, the protruding pads 252 and 352 are previously formed on the first and second semiconductor chips 200 and 300 and then sealed by the seal 500, and the upper insulation layer 180 is then formed. Consequently, the protruding pads 252 and 352 may be relatively close to the upper surface of the upper insulation layer 180. Therefore, the formation of the wiring layer 190 is relatively easier, and occurrence of a wiring failure may be effectively reduced or prevented.

The protruding pads 252 and 352 may be almost the same as or substantially the same as the metal pillars 252 and 352 of the penetrating bumps 250 or the upper bumps 350 of the semiconductor package 1000 of FIG. 1A, except that the protruding pads 252 and 352 without solders are formed on chip pads. Accordingly, the protruding pads 252 and 352 may be formed of Cu. The material used to form the protruding pads 252 and 352 is not limited to Cu, but they may be formed of Al, Ni, Au, or an alloy thereof. The protruding pads 252 and 352 may be formed on the first chip pads 220 and the second chip pads 320 by electrolytic plating or electroless plating. The protruding pads 252 and 352 may also be formed by deposition.

Figure 13:
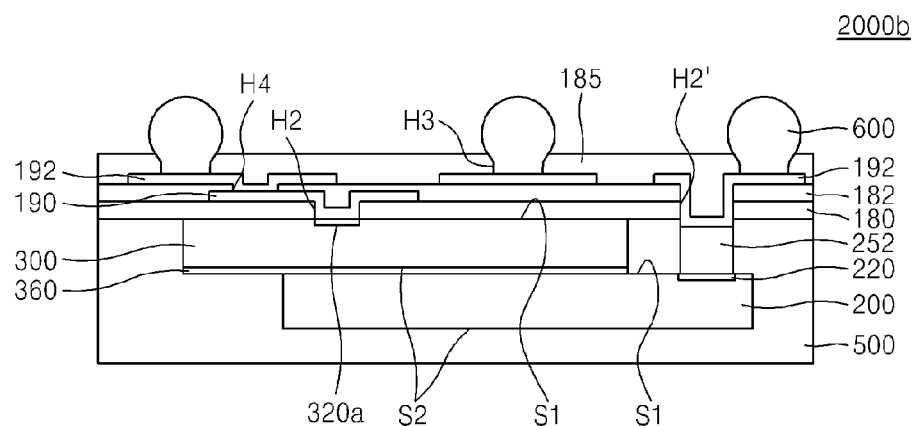

Referring to FIG. 13, the semiconductor package 2000b according to the present embodiment may be different from the semiconductor package 2000 of FIG. 11 in that two upper insulation layers, namely, first and second upper insulation layers 180 and 182, are formed and two wiring layers, namely, first and second wiring layers 190 and 192, are formed. The semiconductor package 2000b may also be different from the semiconductor package 2000 of FIG. 11 in that second chip pads 320a of the second semiconductor chip 300 are disposed to be more centered than the second chip pads 320 of FIG. 11. In addition, protruding pads 252 are formed on the first chip pads 220 of the first semiconductor chip 200.

More specifically, the first upper insulation layer 180 may be formed on the seal 500 and the first surface S1 of the second semiconductor chip 300, and the first wiring layer 190 may be formed on lateral surfaces and bottom surfaces of the holes H2 in the first upper insulation layer 180 and may extend along the upper surface of the first upper insulation layer 180. Next, the second upper insulation layer 182 may be formed to cover the first upper insulation layer 180 and the first wiring layer 190, and may include holes H4 via which a predetermined portion of the first wiring layer 190 is to be exposed. The second wiring layer 192 may be formed on lateral surfaces and bottom surfaces of the holes in the second upper insulation layer 182 and extend along the upper surface of the second upper insulation layer 182. The protection layer 185 having the holes H3 is formed on the second wiring layer 192, and the external connection members 600 are disposed in the holes H3, and thus, may be physically and/or electrically connected to the second wiring layer 192.

As illustrated in FIG. 13, when the second wiring layer 192 is connected to the first chip pads 220 of the first semiconductor chip 200, the second wiring layer 192 may penetrate through both the first and second upper insulation layers 180 and 182, and thus, may be connected to the protruding pads 252.

Due to the use of the two upper insulation layers 180 and 182 and the two wiring layers 190 and 192, the semiconductor package 2000b according to the present embodiment provides freedom for enabling the external connection members 600 to be arranged on less-restricted locations regardless of the location of chip pads of semiconductor chips. As in the semiconductor package 2000c of FIG. 14, when the chip pads of a semiconductor chip are relatively far from the surface on which external connection members are disposed, the use of two upper insulation layers and two wiring layers may address a problem, such as wiring failure, occurring as the wiring layer is deeply formed.

Figure 14:
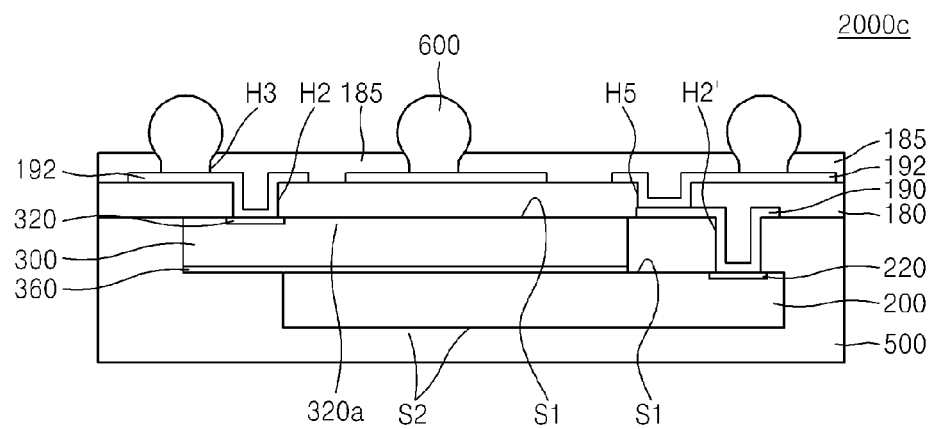

Referring to FIG. 14, the semiconductor package 2000c according to the present embodiment may be different from the semiconductor package 2000 of FIG. 11 in that first chip pads 220 of the first semiconductor chip 200 are connected to external connection members 600 by using two wiring layers, namely, first and second wiring layers 190 and 192. More specifically, the first wiring layer 190 may penetrate through the seal 500 so as to be connected to the first chip pad 220, and may extend along the upper surface of the seal 500.

The upper insulation layer 180 may be formed to cover the first surface S1 of the second semiconductor chip 300, the upper surface of the seal 500, and the first wiring layer 190, and may include holes H5 via which portions of the first wiring layer 190 are exposed. The second wiring layer 192 may penetrate through the upper insulation layer 180 and may be connected to the second chip pad 320 of the second semiconductor chip 300 or the first wiring layer 190, and may extend on the upper insulation layer 180. The protection layer 185 having holes H3 is formed on the second wiring layer 192, and the external connection members 600 are disposed in the holes H3, and thus, may be physically and/or electrically connected to the second wiring layer 192.

As in the semiconductor package 2000 of FIG. 11, when the first chip pads 220 of the first semiconductor chip 200 are a significant distance apart from the upper surface of the upper insulation layer 180, it is difficult to stably connect the first chip pads 220 to the external connection members 600 by using the single wiring layer 190. Accordingly, in the semiconductor package 2000c according to the present embodiment, the first chip pads 220 and the external connection members 600 may be stably connected to each other by forming the two first and second wiring layers 190 and 192.

Figure 15:
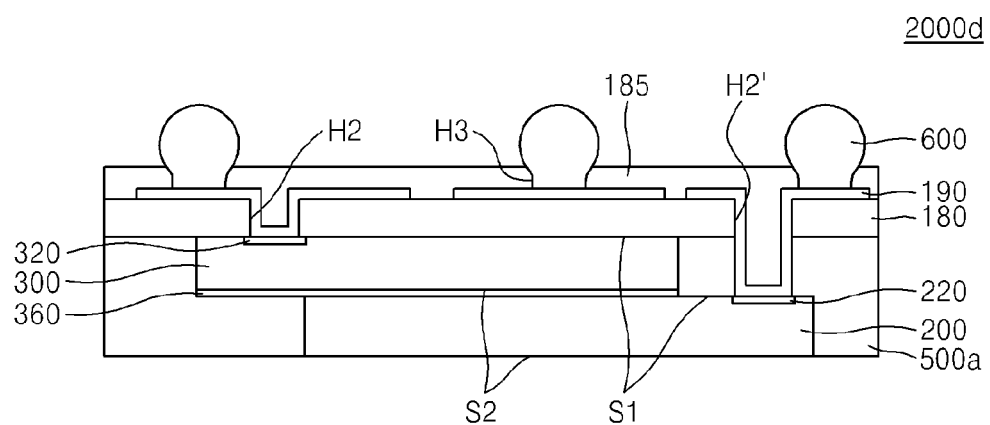

Referring to FIG. 15, the semiconductor package 2000d according to the present embodiment may be different from the semiconductor package 2000 of FIG. 11 in that a seal 500a seals the first and second semiconductor chips 200 and 300 such that a second surface S2 of the first semiconductor chip 200 is exposed. In other words, in the semiconductor package 2000d according to the present embodiment, the seal 500a may cover only lateral surfaces of the first and second semiconductor chips 200 and 300 and the second surface S2 of the second semiconductor chip 300, and may expose the second surface S2 of the first semiconductor chip 200.

Figure 21A:
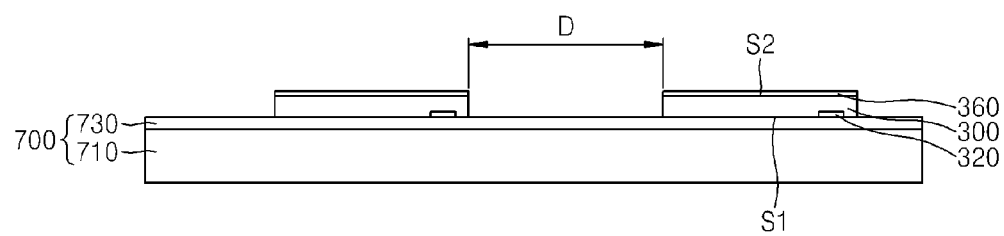
FIGS. 21A through 21H are cross-sectional views illustrating a method of manufacturing the semiconductor package of FIG. 11.
Figure 21B:
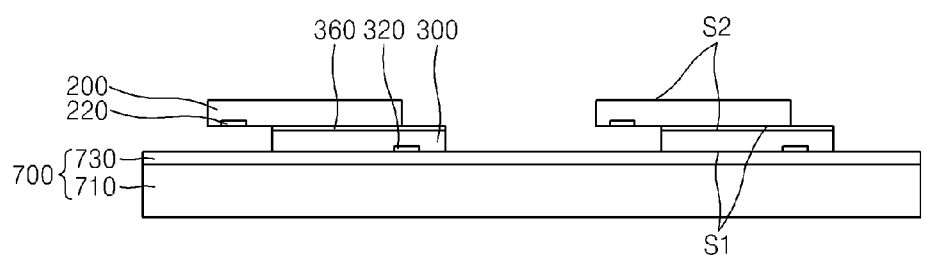
Figure 21C:
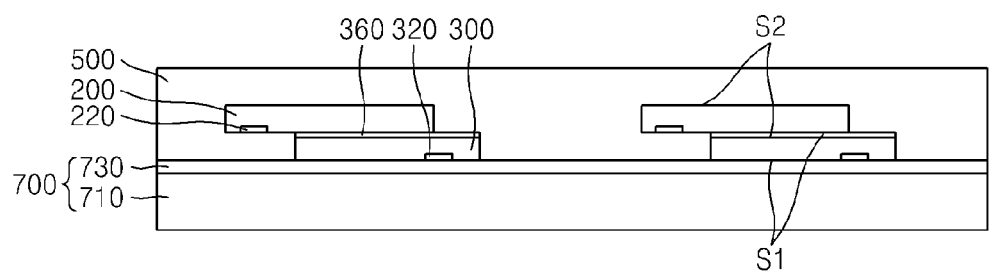

The semiconductor package 2000d having this structure may be obtained by covering the lateral surfaces and the second surfaces S2 of the first and second semiconductor chips 200 and 300 with a seal 500 as illustrated in FIG. 21C, and then removing an upper portion of the seal 500 by grinding such that the second surface S2 of the first semiconductor chip 200 is exposed. As such, the semiconductor package 2000d having the second semiconductor chip 200 whose upper surface S2 is exposed may be formed very thinly due to the small thickness of a thin seal, and accordingly may become an ultra-thin semiconductor package.

Figure 16A:
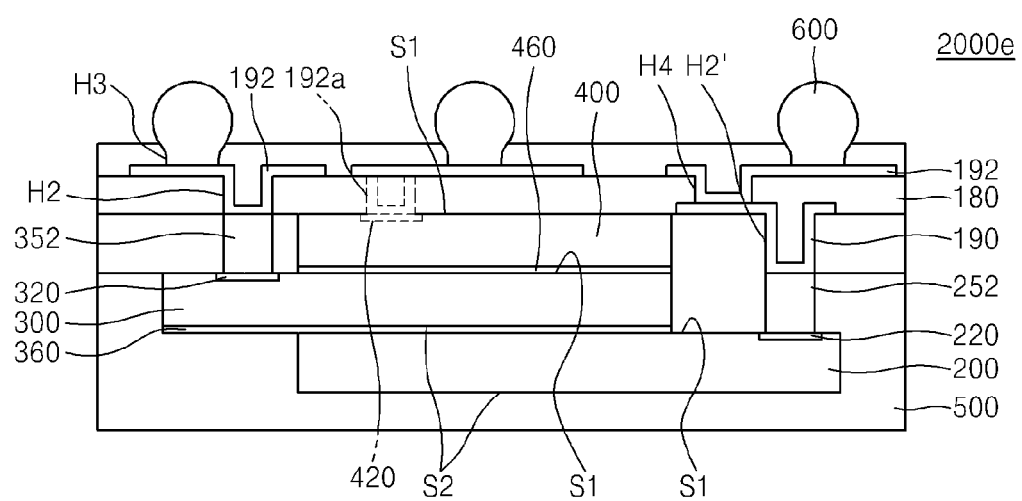
FIGS. 16A and 16B are a cross-sectional view of a semiconductor package in which three semiconductor chips are stacked, according to an embodiment of the inventive concept, and a plan view illustrating a stack of the three semiconductor chips in which the position of chip pads has been reflected.
Figure 16B:
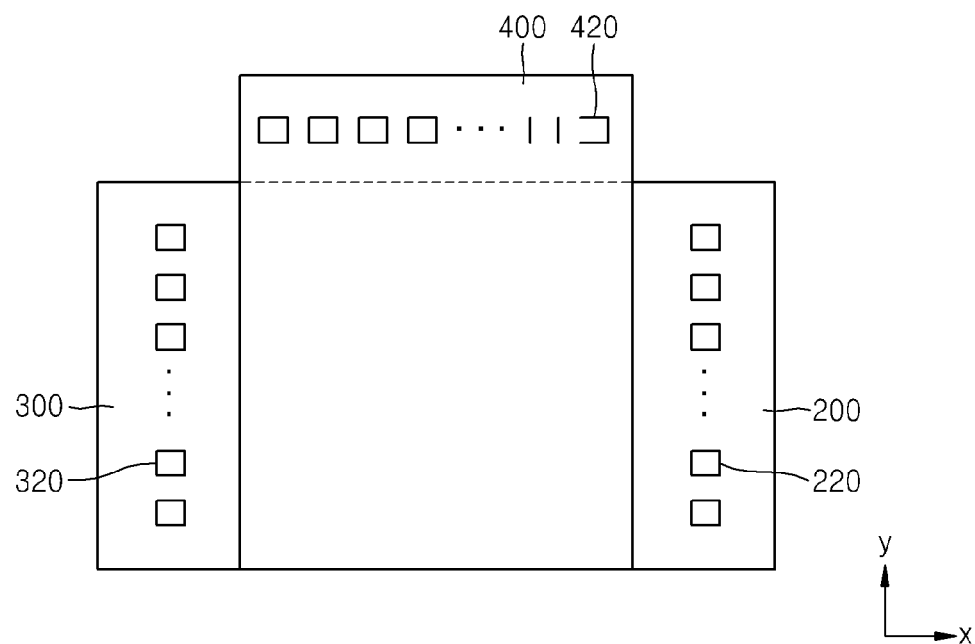

FIGS. 16A and 16B are a cross-sectional view of a semiconductor package 2000e in which three semiconductor chips are stacked, according to an embodiment of the inventive concept, and a plan view illustrating a stack of the three semiconductor chips in which the position of chip pads has been reflected. For convenience of explanation, matters described above with reference to FIGS. 1A through 15 are briefly described, or otherwise not repeated herein.

Referring to FIG. 16A, the semiconductor package 2000e according to the present embodiment may be different from the semiconductor package 2000a of FIG. 12 in that a third semiconductor chip 400 is further stacked on the second semiconductor chip 300. In the semiconductor package 2000e according to the present embodiment, two wiring layers, namely, first and second wiring layers 190 and 192, may be formed to connect first chip pads 220 of the first semiconductor chip 200 to external connection members 600.

For example, the third semiconductor chip 400 may be attached and fixed onto an upper surface of the second semiconductor chip 300 via an attach medium 460 such that a first surface S1 of the third semiconductor chip 400 on which third chip pads 420 are formed faces upward. As illustrated in FIG. 10B, the third semiconductor chip 400 may be disposed such that its longer axis is perpendicular to those of the first and second semiconductor chips 200 and 300. Accordingly, in FIG. 16A, the third semiconductor chip 400 is shorter than the first and second semiconductor chips 200 and 300 in a horizontal direction.

Due to the further stacking of the third semiconductor chip 400, the first chip pads 220 of the first semiconductor chip 200 may be farther from the surface onto which the external connection members 600 are attached. Accordingly, in the semiconductor package 2000e according to the present embodiment, the protruding pads 252 may be formed, and the first wiring layer 190 and the second wiring layer 192 may be formed. The structure or material of the protruding pads 252 may be the same as or substantially the same as that described above with reference to FIG. 12. Structures of the first wiring layer 190 and the second wiring layer 192 or a connection relationship therebetween may be the same as or substantially the same as those described above with reference to FIG. 14. As the second chip pads 320 of the second semiconductor chip 300 are farther from the surface onto which the external connection members 600 are attached, protruding pads 352 may also be formed on the second chip pads 320.

The third chip pads 420 of the third semiconductor chip 400 may be arranged inside the cross-section of FIG. 16A and thus are indicated by a dotted line. The third chip pads 420 may be connected to a second wiring layer 192a, which is indicated by a dotted line and extends along the upper surface of the upper insulation layer 180, and thus may be electrically connected to the external connection members 600.

The semiconductor package 2000e according to the present embodiment may have a fan-out structure in which three semiconductor chips are stacked. Accordingly, the semiconductor package 2000e according to the present embodiment is able to operate fast due to the characteristics of a wiring structure, and may satisfy a need for large capacity due to a structure in which a plurality of semiconductor chips are stacked, despite of having a very small size. Although the semiconductor package 2000e according to the present embodiment has a fan-out structure in which three semiconductor chips are stacked, the semiconductor package 2000e may have a fan-out structure in which at least four semiconductor chips are stacked. For example, a semiconductor package having a fan-out structure in which at least four semiconductor chips are stacked may be obtained by appropriately adjusting the direction in which semiconductor chips are stacked and by appropriately selecting the numbers or structures of upper insulation layers and wiring layers.

Referring to FIG. 16B, the third semiconductor chip 400 may be disposed with its longer axis lying in a y direction, and thus may be perpendicular to the first and second semiconductor chips 200 and 300 of which longer axes are in an x direction. As illustrated in FIG. 16B, the third chip pads 420 may be arranged along an upper side surface of the third semiconductor chip 400 in the y direction. However, the location on the third semiconductor chip 400 where the first chip pads 420 are arranged is not limited to the above-described arrangement location.

In other words, since the third semiconductor chip 400 is disposed at the top of a semiconductor chip stack, it may not be blocked by any semiconductor chip, and thus the third chip pads 420 may be arranged on any portion of the third semiconductor chip 400. For example, the third chip pads 420 may be arranged along a lower side surface of the third semiconductor chip 400 in the y direction, or along a right and/or left side surface thereof. The structure of the second wiring layer 192 may vary according to the arrangement location of the third chip pads 420.

FIGS. 17A through 17D are sectional views illustrating a method of manufacturing the semiconductor package 10000 of FIG. 1A. For convenience of explanation, matters described above with reference to FIG. 1A are briefly described, or otherwise not repeated herein.

Figure 17A:
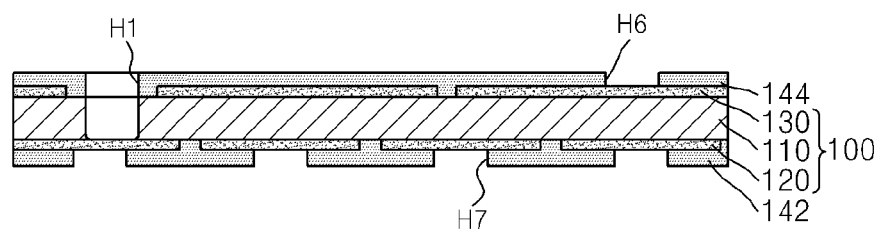
FIGS. 17A through 17D are cross-sectional views illustrating a method of manufacturing the semiconductor package of FIG. 1A.

Referring to FIG. 17A, the multi-layered substrate 100 is prepared, and the through holes H1 are formed in the multi-layered substrate 100. The multi-layered substrate 100 may include the center insulation layer 110, the lower wiring layer 120, and the upper wiring layer 130. The through holes H1 penetrate through the upper wiring layer 130 and the central insulation layer 110, and bottoms of the through holes H1 may be blocked by the lower wiring layer 120.

As described above about the semiconductor package 1000 of FIG. 1A, the lower wiring layer 120 may function as a pad, below the through holes H1. A special pad may be formed as in the semiconductor package 1000a of FIG. 2. A method of forming the through holes H1 is described in more detail below with reference to FIGS. 18A through 19D.

Protection layers, namely, the lower protection layer 142 and the upper protection layer 144, may be formed on the upper surfaces of the lower wiring layer 120 and the upper wiring layer 130, respectively. Holes H6 may be formed in the upper protection layer 130 and may expose predetermined portions of the upper wiring layer 130. Later, the upper bumps 350 may be disposed on the portions of the upper wiring layer 130 that are exposed via the holes H6. Holes H7 may be formed in the lower protection layer 142 and may expose predetermined portions of the lower wiring layer 120. Later, the external connection members 600 may be disposed on the portions of the lower wiring layer 120 that are exposed via the holes H7.

Figure 17B:
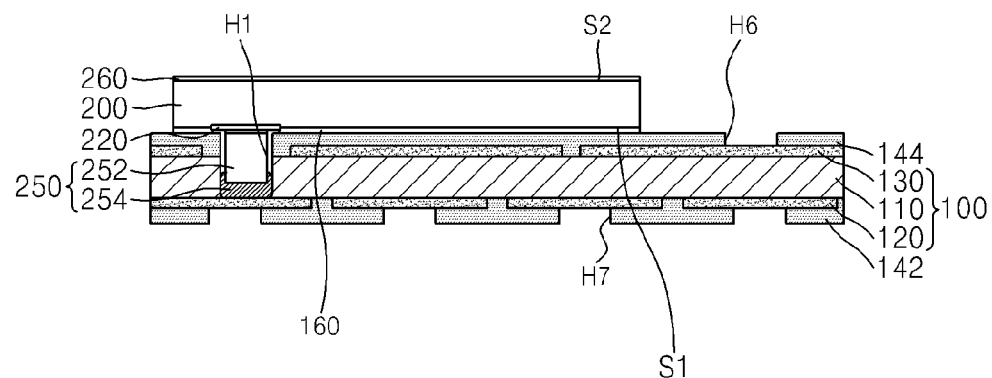

Referring to FIG. 17B, the first semiconductor chip 200 may be stacked on the multi-layered substrate 100. The first semiconductor chip 200 may be primarily attached and fixed onto the upper protection layer 144 of the multi-layered substrate 100 via the attach medium 160, and the first semiconductor chip 200 may be more firmly attached to and stacked on the multi-layered substrate 100 by coupling the penetrating bumps 250 to the lower wiring layer 120. The attach medium 260, such as an adhesion film or a liquid adhesive, may be coated on the second surface S2 of the first semiconductor chip 200.

The first semiconductor chip 200 may be directly connected to the lower wiring layer 120 by using the penetrating bumps 250, and the first semiconductor chip 200 may be stacked on the multi-layered substrate 100 with a minimum distance therebetween. Accordingly, each penetrating bump 250 may have a thickness corresponding to a depth of each through hole H1, namely, to a sum of the thicknesses of the upper protection layer 144, the upper wiring layer 130, and the central insulation layer 110.

Figure 17C:
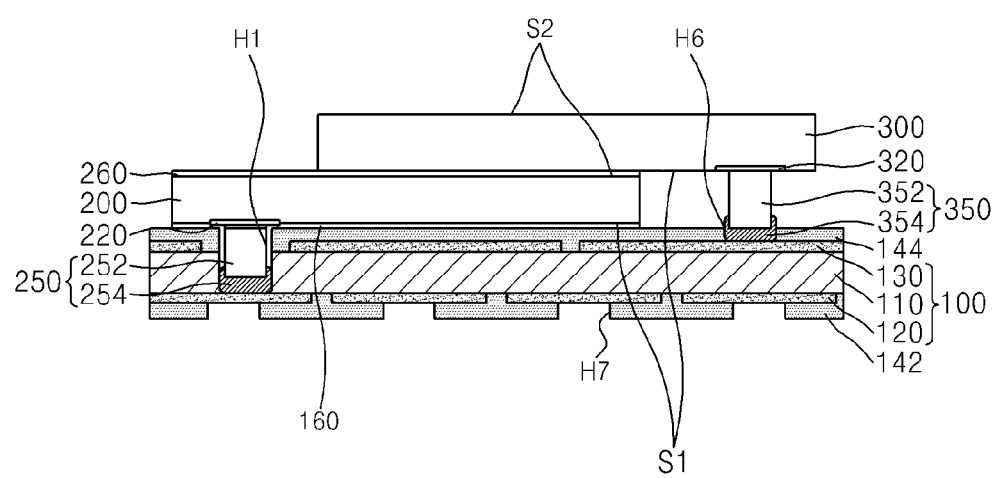

Referring to FIG. 17C, after the first semiconductor chip 200 is stacked, the second semiconductor chip 300 may be stacked on the first semiconductor chip 200. Similar to the first semiconductor chip 200, the second semiconductor chip 300 may be primarily fixed to the first semiconductor chip 200 by the attach medium 260, and the second semiconductor chip 300 may be firmly fixed to the first semiconductor chip 200 by coupling the upper bumps 350 to the upper wiring layer 130.

In order for the second semiconductor chip 300 to be connected to the multi-layered substrate 100 via the upper bumps 350 by flip-chip bonding, the second semiconductor chip 300 may be stacked in an offset structure in which the second semiconductor chip 300 protrudes from the first semiconductor chip 200. Because the second semiconductor chip 300 is connected to the upper wiring layer 130 via the upper bumps 350, the thickness of each upper bump 350 may correspond to that of the first semiconductor chip 200.

Figure 17D:
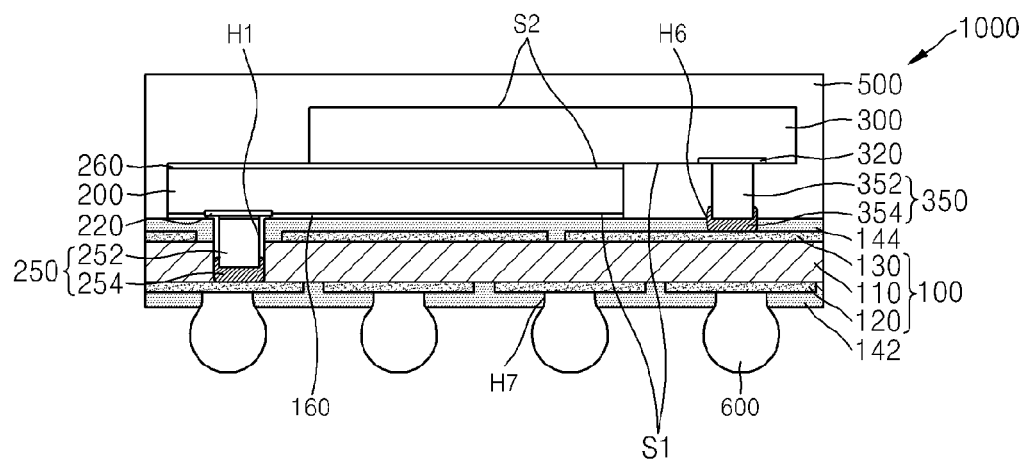

Referring to FIG. 17D, after the second semiconductor chip 300 is stacked, the lateral surfaces and the second surfaces S2 of the first and second semiconductor chips 200 and 300 may be sealed by the seal 500. After the sealing by the seal 500, to obtain a thin semiconductor package like the semiconductor package 1000c of FIG. 4, the second surface S2 of the second semiconductor chip 300 may be exposed by removing an upper portion of the seal 500 by grinding. This grinding process may be selectively performed.

After the sealing by the seal 500, the external connection members 600 may be disposed on the lower surface of the multi-layered substrate 100, namely, in the holes H7 of the lower protection layer 142 and may be connected to the lower wiring layer 120, thereby completing the formation of the semiconductor package 1000.

Although a method of manufacturing a single semiconductor package has been described above, a plurality of first semiconductor chips 200 may be arranged on a very wide proto-type multi-layered substrate in practice, and second semiconductor chips 300 may be respectively stacked on the first semiconductor chips 200. Thereafter, the seal 500 is formed by molding the entire stack of the first and second semiconductor chips 200 and 300 on the proto-type multi-layered substrate, and the resultant structure is singulated into individual semiconductor packages, thereby manufacturing a plurality of semiconductor packages at a time.

FIGS. 18A through 18E are sectional views illustrating a method of forming each through hole H1 during the semiconductor package manufacturing process illustrated in FIG. 17A, according to an embodiment of the inventive concept. For convenience of explanation, matters described above with reference to FIGS. 1A and 17A are briefly described, or otherwise not repeated herein.

Figure 18A:
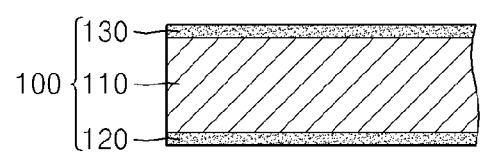
FIGS. 18A through 18E are cross-sectional views illustrating a method of forming a through hole during the semiconductor package manufacturing process illustrated in FIG. 17A, according to an embodiment of the inventive concept.

Referring to FIG. 18A, the multi-layered substrate 100 is prepared. The multi-layered substrate 100 may include the central insulation layer 110, the lower wiring layer 120, and the upper wiring layer 130. The multi-layered substrate 100 may be fabricated by coating with Cu foils both sides of a plate obtained by compressing, for example, phenol or epoxy glass (or FR-4) resin, to have a certain thickness, and patterning the Cu foils on the both sides.

Figure 18B:
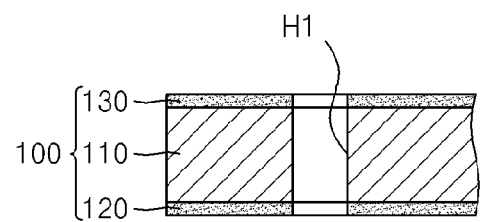

Referring to FIG. 18B, a through hole H1 is formed in the multi-layered substrate 100. The through hole H may penetrate all of the central insulation layer 110, the lower wiring layer 120, and the upper wiring layer 130. The through hole H1 may be formed by chemical etching or by drilling using laser. In general, laser drilling is used. However, when a Cu foil is relatively thick, chemical etching may be used.

In laser drilling, a $CO_2$ laser or a YAG laser, for example, may be used. The $CO_2$ laser has high power and may be used to form a hole that penetrates through the entire substrate. The YAG laser has low power and may be used to penetrate some layers of a substrate. In the present embodiment, since the through hole H1 is formed to penetrate through the entire multi-layered substrate 100, a $CO_2$ laser may be used. The through hole H1 may be formed by chemical etching.

Figure 18C:
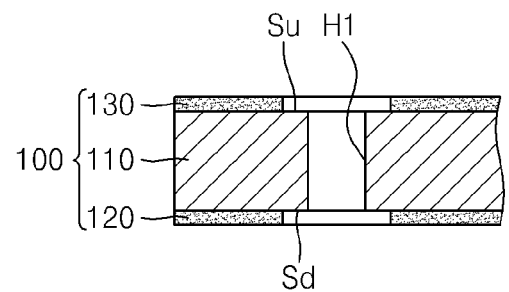

Referring to FIG. 18C, portions of the lower wiring layer 120 and the upper wiring layer 130 around the through hole H1 are etched out to expose an upper surface Su and a lower surface Sd of the central insulation layer 110 around the through holes H1. As such, the reason why the portions of the lower wiring layer 120 and the upper wiring layer 130 around the through hole H1 are etched is to prevent a disorder, such as, a short, from occurring due to unwanted contact with the upper wiring layer 130 during subsequent connection between the penetrating bumps 250 and the lower wiring layer 120.

Figure 18D:
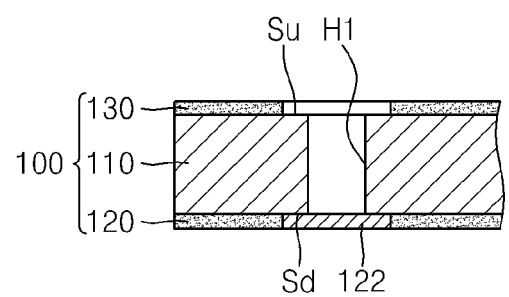

Referring to FIG. 18D, after the upper surface Su and the lower surface Sd of the central insulation layer 110 around the through holes H1 are exposed, a conductive layer 122 is formed to block the bottom of the through hole H1. The conductive layer 122 may constitute a part of the lower wiring layer 120, and may function as a pad. The conductive layer 122 may be formed using a process of attaching an individual Cu foil to the bottom of the through hole H1. The conductive layer 122 may also be formed by deposition, plating, or the like.

Figure 18E:
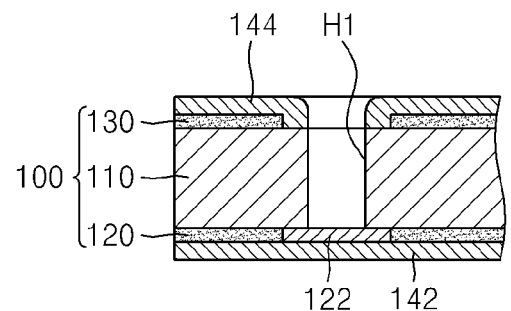

Referring to FIG. 18E, after the formation of the conductive layer 122, the lower protection layer 142 and the upper protection layer 144 are formed to cover the entire surfaces of the lower wiring layer 120 and the upper wiring layer 130, respectively. As illustrated in FIG. 18E, the upper protection layer 144 may cover the upper surface Su of the central insulation layer 110 that is exposed around the through hole H1. Accordingly, the upper protection layer 144 may prevent a failure from occurring due to connection of the penetrating bumps 250 to the upper wiring layer 130 during connection between the penetrating bumps 250 and the lower wiring layer 120. Thereafter, the lower protection layer 142 and the upper protection layer 144 are patterned to form the holes H6 and H7, thereby obtaining the multi-layered substrate 100 having the through holes H1 as illustrated in FIG. 17A. During the formation of the holes H6 and H7, the material of the upper protection layer 144 that may exist within the through hole H1 may be removed.

FIGS. 19A through 19D are sectional views illustrating a method of forming a through hole during the semiconductor package manufacturing process illustrated in FIG. 17A, according to another embodiment of the inventive concept. For convenience of explanation, matters described above with reference to FIGS. 1A and 17A are briefly described, or otherwise not repeated herein.

Figure 19A:
FIGS. 19A through 19D are cross-sectional views illustrating a method of forming a through hole during the semiconductor package manufacturing process illustrated in FIG. 17A, according to another embodiment of the inventive concept.

Referring to FIG. 19A, two multi-layered substrates, namely, first and second multi-layered substrates 100a and 100b, are prepared. The first and second multi-layered substrates 100a and 100b may be single-sided substrates in which only single wiring layers 130 and 120 are formed on central insulation layers 110a and 100b, respectively. More specifically, the first multi-layered substrate 100a may include the central insulation layer 110a and the upper wiring layer 130, and the second multi-layered substrate 100b may include the central insulation layer 110b and the lower wiring layer 120. The first multi-layered substrate 100a and the second multi-layered substrate 100b have the same or substantially the same structures. However, in FIG. 19A, one of the first and second multi-layered substrates 100a and 100b is shown upside down.

Figure 19B:
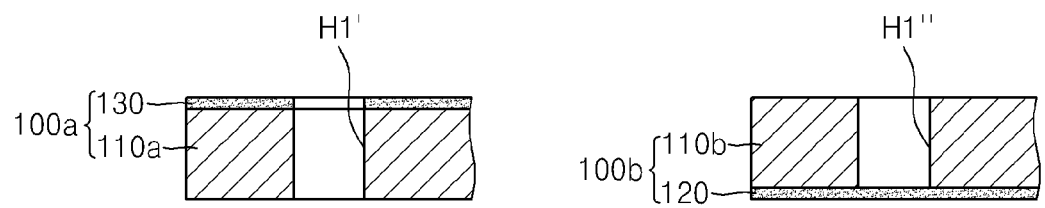

Referring to FIG. 19B, a first through hole H1' is formed in the first multi-layered substrate 100a, and a second through hole H1" is formed in the second multi-layered substrate 100b. The first through hole H1' may be formed to penetrate the entire first multi-layered substrate 100a, namely, both the central insulation layer 110a and the upper wiring layer 130. The first through hole H1' may be formed using a $CO_2$ laser, for example. The second through hole H1" may be formed to penetrate only the central insulation layer 110b of the second multi-layered substrate 100b and not to penetrate the lower wiring layer 120. The second through hole H1" may be formed by chemical etching.

Figure 19C:
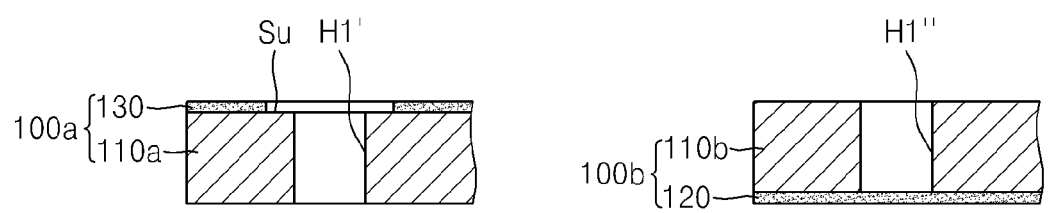

Referring to FIG. 19C, a portion of the upper wiring layer 130 round the first through hole H1' of the first multi-layered substrate 100a is etched out to expose an upper surface Su of the central insulation layer 110a around the first through hole H1'. The reason why a portion of the upper wiring layer 130 around the first through hole H1' is etched may be the same as or substantially the same as what has been described above with reference to FIG. 18C.

Figure 19D:
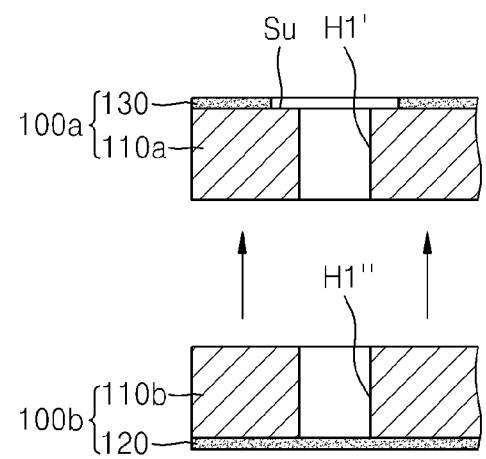

Referring to FIG. 19D, the second multi-layered substrate 100b is coupled to the first multi-layered substrate 100a as indicated by arrows. The coupling may be performed by thermal compression or the like. The coupling may be conducted such that the first through hole H1' of the first multi-layered substrate 100a is aligned with the second through hole H1" of the second multi-layered substrate 100b. Accordingly, a resultant structure after the coupling between the first multi-layered substrate 100a and the second multi-layered substrate 100b may be similar to the structure of the multi-layered substrate 100 having the through hole H1 illustrated in FIG. 18D. Then, the lower protection layer 142 and the upper protection layer 144 are formed and patterned to obtain the multi-layered substrate 100 having the through holes H1 as illustrated in FIG. 17A.

FIGS. 20A through 20D are sectional views illustrating a method of forming a sidewall conductive layer in a through hole H1 in order to connect the upper wiring layer 130 to the lower wiring layer 120 in the semiconductor package 1000 of FIG. 1A. For convenience of explanation, matters described above with reference to FIGS. 1A and 17A are briefly described, or otherwise not repeated herein.

Figure 20A:
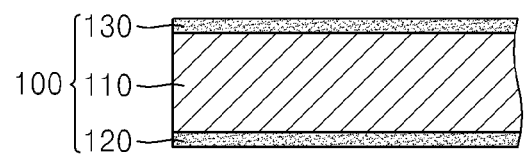
FIGS. 20A through 20D are cross-sectional views illustrating a method of forming a sidewall conductive layer within a through hole in order to connect an upper wiring layer to a lower wiring layer in the semiconductor package of FIG. 1A.

Referring to FIG. 20A, the multi-layered substrate 100 is prepared. The multi-layered substrate 100 may include the central insulation layer 110, the lower wiring layer 120, and the upper wiring layer 130.

Figure 20B:
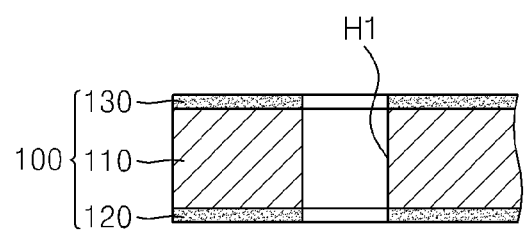

Referring to FIG. 20B, the through hole H1 is formed in the multi-layered substrate 100. The through hole H1 may penetrate all of the central insulation layer 110, the lower wiring layer 120, and the upper wiring layer 130. The through hole H1 may be formed by laser or chemical etching.

Figure 20C:
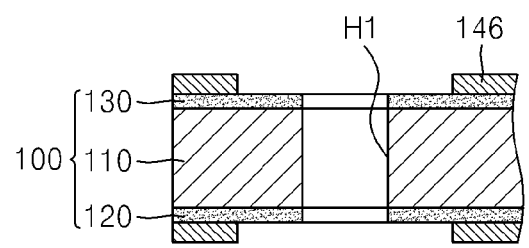

Referring to FIG. 20C, after the formation of the through hole H1, a protection layer 146 is formed on predetermined portions of the lower wiring layer 120 and the upper wiring layer 130. In a subsequent process, no sidewall conductive layers may be formed on the predetermined portions of the lower wiring layer 120 and the upper wiring layer 130 where the protection layer 146 is formed. The protection layer 146 may be formed of a general oxide or nitride insulation layer or may be formed of SR or DFR.

Figure 20D:
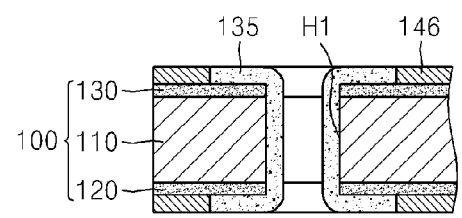

Referring to FIG. 20D, the sidewall conductive layer 135 is formed on a portion of the lower surface of the lower wiring layer 120 except for the portion on which the protection layer 146 has been formed, a portion of the upper surface of the upper wiring layer 130 except for the portion on which the protection layer 146 has been formed, and a sidewall of the through hole H1. The sidewall conductive layer 135 may be formed by both non-electrolyte plating and electrolyte plating. More specifically, non-electrolyte plating may be first performed, and then electrolyte plating may be performed by using a non-electrolyte plated layer obtained by the non-electrolyte plating as a seed metal. A plating layer may be formed on the sidewall of the through hole H1 by non-electrolyte plating.

The lower wiring layer 120 and the upper wiring layer 130 of the multi-layered substrate 100 may be electrically connected to each other via the sidewall conductive layer 135. The sidewall conductive layer 135 may be formed of Cu, such as Cu foil. In some cases, the sidewall conductive layer 135 may be formed of a metal other than Cu. For example, the sidewall conductive layer 135 may be formed of Ni, Ni/Cu, or the like. The sidewall conductive layer 135 may electrically connect the lower wiring layer 120 and the upper wiring layer 130 to each other by functioning as the internal wiring of the multi-layered substrate 100.

FIGS. 21A through 21H are sectional views illustrating a method of manufacturing the semiconductor package 2000 of FIG. 11. For convenience of explanation, matters described above with reference to FIG. 11 are briefly described, or otherwise not repeated herein.

Referring to FIG. 21A, a plurality of second semiconductor chips 300 are attached to a tape 730 on a carrier substrate 700. A surface of each second semiconductor chip 300 that is attached to the tape 730 is the first surface S1 on which the second chip pads 320 are formed. The carrier substrate 700 may include a carrier metal 710 and the tape 730. The tape 730 may be a detachable tape. Before the attachment of the second semiconductor chips 300, a patterning process on the tape 730 for aligning the semiconductor chips 300 may be performed.

In more detail, the carrier substrate 700 may have a size equal to or greater than the size of a wafer, and may include the carrier metal 710 at the bottom and the tape 730 at the top. The tape 730 may be a detachable tape. For example, the tape 730 may be a laminate or a UV film capable of being easily removed through UV radiation. A pattern is formed on the tape 730, and is a mark for alignment of a die to be attached, namely, the second semiconductor chips 300. The second semiconductor chips 300 are accurately attached to the location of the formed pattern. Therefore, subsequent processes may be precisely conducted.

A distance between the second semiconductor chips 300 to be attached onto the carrier substrate 700 may be suitably controlled according to required sizes of the semiconductor package 2000. At present, the sizes of the second semiconductor chips 300 are decreased, but the sizes of semiconductor packages are standardized. Thus, there is a limit in reducing the distance D between semiconductor chips. For example, in packages having a fan-out structure, an upper insulation layer and a wiring layer may be formed on a portion of a carrier substrate having no semiconductor chips, and external connection members may be disposed on the upper insulation layer and the wiring layer.

Figure 21D:
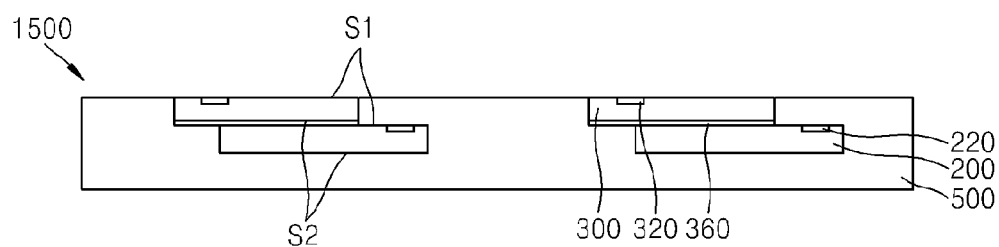

For reference, not the first semiconductor chips 200 but the second semiconductor chips 300 are first attached onto the carrier substrate 700. In FIG. 21D and its subsequent figures, the drawings are turned upside down such that the second semiconductor chips 300 face upward and the first semiconductor chips 200 are positioned below the second semiconductor chips 300. Accordingly, the turned structures have the same or substantially the same structure as the semiconductor package 2000 of FIG. 11, and are thus easily understood.

Referring to FIG. 21B, the first semiconductor chips 200 are stacked on the second semiconductor chips 300. The first semiconductor chips 200 may be stacked by being attached and fixed to the second semiconductor chips 300 via the attach medium 360 formed on the second semiconductor chips 300. As illustrated in FIG. 21B, the first semiconductor chips 200 may be stacked such that their first surfaces S1 on which the first chip pads 220 are formed face the carrier substrate 700. The first semiconductor chips 200 may be stacked on the second semiconductor chips 300 to have an offset structure in which the first semiconductor chips 200 protrude from the second semiconductor chips 300 such that the first chip pads 220 are exposed.

Referring to FIG. 21C, after the first semiconductor chips 200 are stacked, the first and second semiconductor chips 200 and 300 are sealed by the seal 500 such as epoxy resin. For reference, since the first surfaces S1 of the second semiconductor chips 300 are attached to the tape 730 of the carrier substrate 700, only the second surfaces S2 and the lateral surfaces of the second semiconductor chips 300 may be covered by the seal 500, and the first surfaces S1 of the second semiconductor chips 300 may not be sealed. The second surfaces S2, the lateral surface, and exposed portions of the first surfaces S1 of the first semiconductor chips 200 may be sealed by the seal 500.

Referring to FIG. 21D, after the sealing, a package complex 1500 including the first and second semiconductor chips 200 and 300 and the seal 500 is separated from the carrier substrate 700. After this separation, the first surfaces S1 of the second semiconductor chips 300 are exposed. For convenience of understanding, the package complex 1500 is turned upside down so as to be matched with the structure of the semiconductor package 2000 of FIG. 11.

Figure 21E:
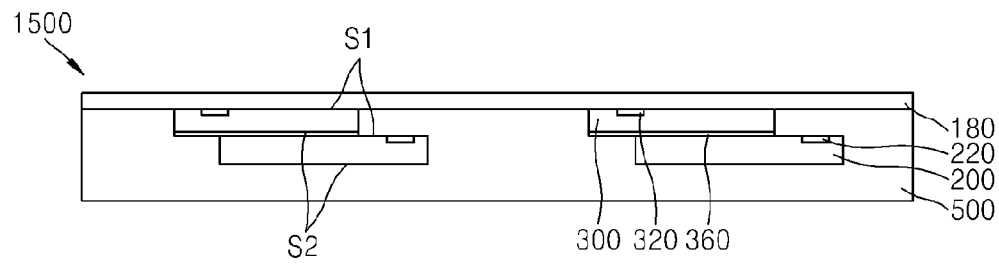

Referring to FIG. 21E, the upper insulation layer 180 is formed on the upper surface of the package complex 1500, namely, on the upper surface of the seal 500 and the first surfaces S1 of the second semiconductor chips 300. For example, the upper insulation layer 180 may be formed of an oxide layer, a nitride layer, or a double layer formed of an oxide layer and a nitride layer. The upper insulation layer 180 may be formed of an oxide layer, for example, a $SiO_2$ layer, by HDP-CVD. The upper insulation layer 180 may protect the first surfaces S1 of the second semiconductor chips 300 from external physical and/or chemical damages.

Figure 21F:
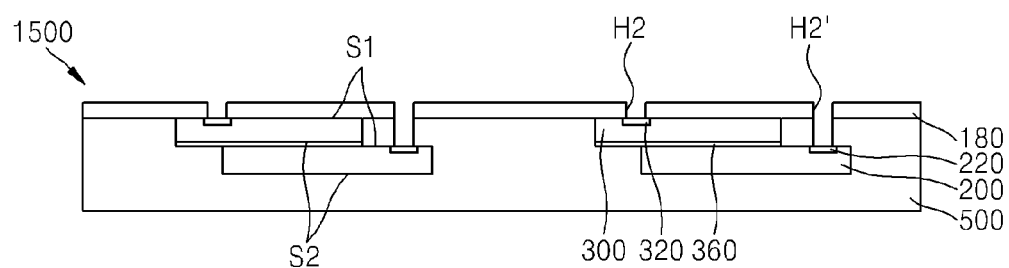

Referring to FIG. 21F, predetermined portions of the upper insulation layer 180 are etched to form the holes H2 exposing the second chip pads 320 of the second semiconductor chips 300 and the holes H2' exposing the first chip pads 220 of the first semiconductor chips 200. The holes H2 exposing the second chip pads 320 and the holes H2' exposing the first chip pads 220 may be formed simultaneously or may be formed separately. For example, the holes H2 and H2' may be formed simultaneously when the seal 500 and the upper insulation layer 180 have similar etching speeds with respect to a certain etching solution. Otherwise, the holes H2 and H2' may be formed separately.

Figure 21G:
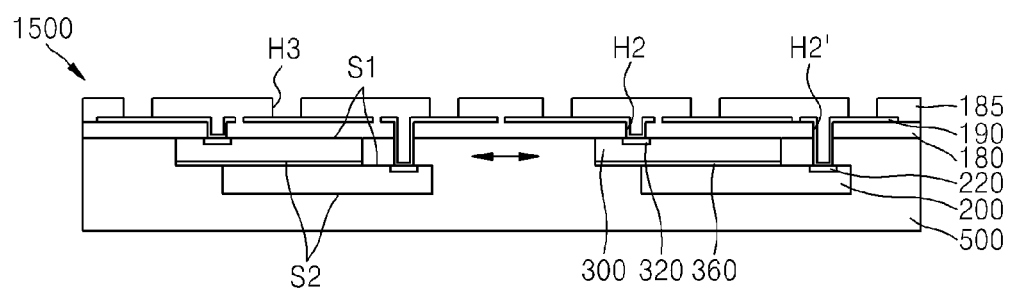

Referring to FIG. 21G, the wiring layer 190 is formed and patterned on the upper insulation layer 180. Accordingly, the wiring layer 190 is connected to the first and second chip pads 220 and 320 via the holes H2 and H2' and extends along the upper surface of the upper insulation layer 180. The protection layer 185 is formed on the upper insulation layer 180 and the wiring layer 190. The protection layer 185 may include the plurality of holes H3 exposing some portions of the wiring layer 190. The protection layer 185 may be formed of SR or DFR, for example. A general insulation layer, such as an oxide layer or a nitride layer, is not excluded.

Figure 21H:
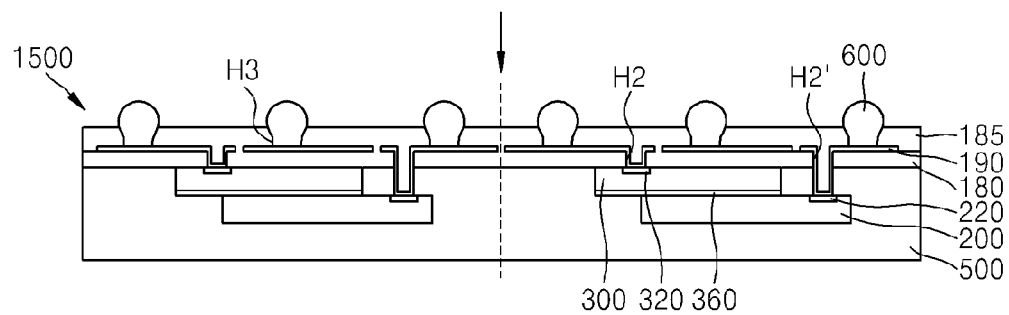

Referring to FIG. 21H, the external connection members 600 are disposed in the holes H3 of the protection layer 185 and thus are physically and/or electrically connected to the wiring layer 190. The external connection member 600 may be, for example, bumps or solder balls. After the formation of the external connection members 600, the package complex 1500 is singulated along an arrow to obtain individual semiconductor packages. Thus, the semiconductor package 2000 of FIG. 11 corresponding to each individual semiconductor package is manufactured.

Figure 22:
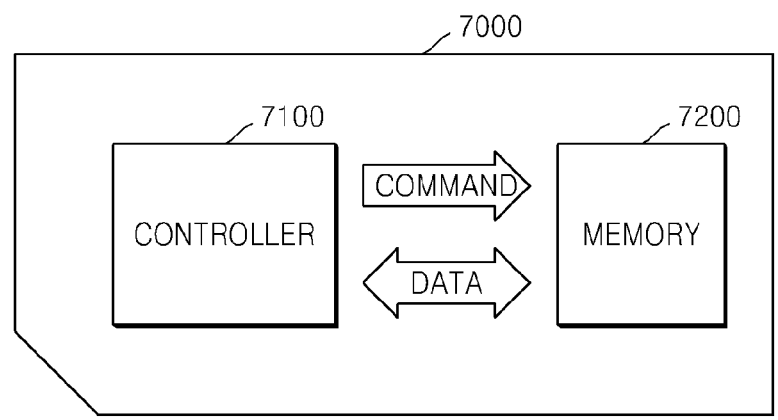
FIG. 22 is a block diagram of a memory card according to an embodiment of the inventive concept.

FIG. 22 is a block diagram of a memory card 7000 according to an embodiment of the inventive concept.

Referring to FIG. 22, a controller 7100 and a memory 7200 may be arranged in the memory card 7000 so as to exchange electrical signals with each other. For example, when a command is issued by the controller 7100, the memory 7200 may transmit data. The controller 7100 and/or the memory 7200 may include a semiconductor package according to one of the embodiments illustrated in FIG. 1A, FIGS. 2-6A, FIGS. 7-8, FIG. 10A, and FIGS. 11-16A. The memory 7200 may include a memory array (not shown) or a memory array bank (not shown).

The memory card 7000 may be used in a memory device such as any card, for example, a memory stick card, a smart media (SM) card, a secure digital (SD) card, a mini SD card, or a multi media card (MMC).

Figure 23:
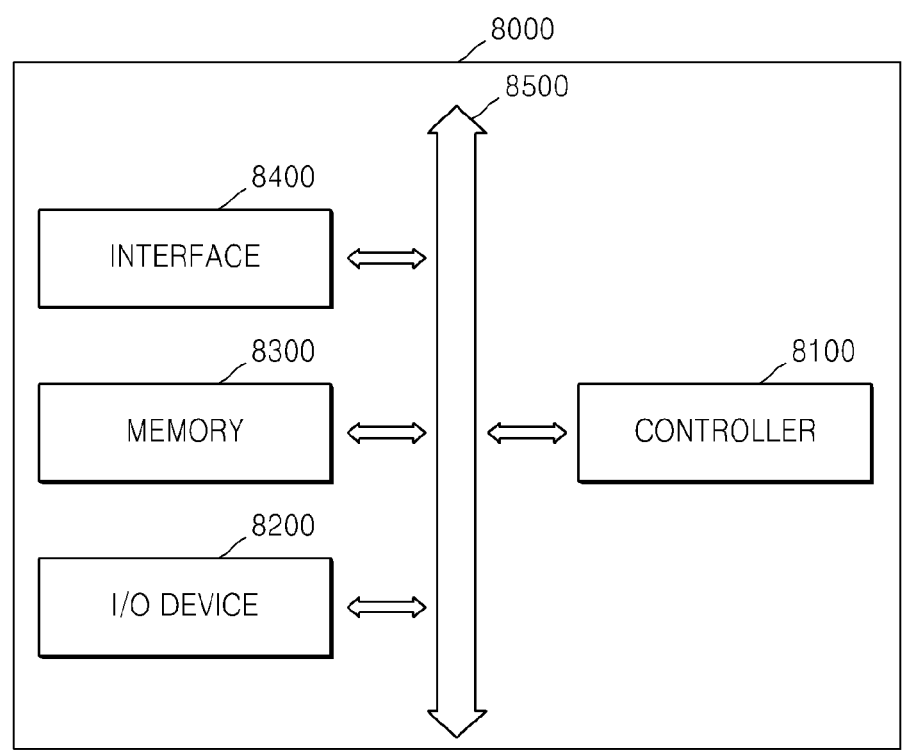
FIG. 23 is a schematic block diagram of an electronic system according to an embodiment of the inventive concept.

FIG. 23 is a schematic block diagram of an electronic system 8000 according to an embodiment of the inventive concept.

Referring to FIG. 23, the electronic system 8000 may include a controller 8100, an input/output (I/O) device 8200, a memory 8300, and an interface 8400. The electronic system 8000 may be a mobile system or a system that transmits or receives information. The mobile system may be a PDA, a portable computer, a web tablet, a wireless phone, a mobile phone, a digital music player, or a memory card.

The controller 8100 may execute a program and control the electronic system 8000. The controller 8100 may be a microprocessor, a digital signal processor, a microcontroller, or a device similar to these devices. The I/O device 8200 may be used to input or output the data of the electronic system 8000.

The electronic system 8000 may be connected to an external device, for example, a personal computer or a network, by using the I/O device 8200, and thus may exchange data with the external device. The I/O device 8200 may be a keypad, a keyboard, or a display. The memory 8300 may store a code and/or data for operating the controller 8100, and/or store data processed by the controller 8100. The controller 8100 and the memory 8300 may include a multi-channel package according to one of the embodiments illustrated in FIG. 1A, FIGS. 2-6A, FIGS. 7-8, FIG. 10A, and FIGS. 11-16A. The interface 8400 may be a data transmission path between the electronic system 8000 and another external device. The controller 8100, the I/O device 8200, the memory 8300, and the interface 8400 may communicate with each other via a bus 8500.

Figure 24:
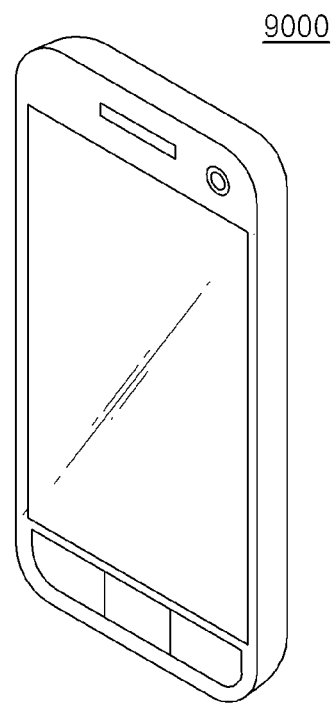
FIG. 24 is a perspective view of an electronic device to which a semiconductor package according to an embodiment of the inventive concept is applicable.

FIG. 24 is a perspective view of an electronic device 9000 to which a flip-chip package according to an embodiment of the inventive concept is applicable.

In FIG. 24, the electronic device 9000 is a mobile phone 9000 to which the electronic system 8000 of FIG. 23 is applied. The electronic system 8000 of FIG. 23 may be used in portable notebooks, MP3 players, navigation, portable multimedia players (PMPs), solid state disks (SSDs), cars, or household appliances.

While the inventive concept has been particularly shown and described with reference to exemplary embodiments thereof, it will be understood that various changes in form and details may be made therein without departing from the spirit and scope of the following claims.

What is claimed is:

1. A semiconductor package comprising:
a first semiconductor chip having a plurality of first chip pads arranged on a first surface of the first semiconductor chip along one side thereof;
a second semiconductor chip stacked on the first surface of the first semiconductor chip in an offset structure, wherein a first edge of the second semiconductor chip is above the first semiconductor chip, and a second edge of the second semiconductor chip which is opposite to the first edge is not above the first semiconductor chip, such that the first chip pads are exposed;
a seal that seals lateral surfaces of the first semiconductor chip and the second semiconductor chip;
an upper insulation layer that covers the seal and the second semiconductor chip and exposes second chip pads of the second semiconductor chip that are buried; and
a wiring layer that is connected to the second chip pads through the upper insulation layer and extends along an upper surface of the upper insulation layer.

2. The semiconductor package of claim 1, wherein:
the wiring layer is referred to as a first wiring layer; and
the semiconductor package further comprises a second wiring layer that is connected to the first chip pads through the seal and the upper insulation layer,
wherein the semiconductor package further includes protruding pads each including a filler disposed on respective chip pads from among the first chip pads, wherein the protruding pads are configured to reduce a depth by which the second wiring layer penetrates through the seal and the upper insulation layer to connect to the first chip pads.

3. The semiconductor package of claim 1, further comprising a protection layer that covers the upper insulation layer and the wiring layer and that includes holes via which portions of the wiring layer are exposed.

4. The semiconductor package of claim 3, further comprising external connection members disposed in the holes and connected to the wiring layer.

5. The semiconductor package of claim 1, wherein the upper insulation layer is referred to as a first upper insulation layer, and wherein the wiring layer is referred to as a first wiring layer, the semiconductor package further comprising:
a second upper insulation layer that covers the first upper insulation layer and the first wiring layer and that includes first holes via which portions of the first wiring layer are exposed;
a second wiring layer connected to the first wiring layer through the first holes and extending along an upper surface of the second upper insulation layer; and
a protection layer that covers the second upper insulation layer and the second wiring layer and that includes second holes via which portions of the second wiring layer are exposed.

6. The semiconductor package of claim 5, wherein:
the second wiring layer is connected to the first chip pads through the seal, through the first upper insulation layer, and through the second upper insulation layer; and
the semiconductor package further includes protruding pads each including a filler disposed on respective chip pads from among the first chip pads, wherein the protruding pads are configured to reduce a depth by which the second wiring layer penetrates through the seal, through the first upper insulation layer, and through the second upper insulation layer, to connect to the first chip pads.

7. The semiconductor package of claim 6, wherein:
the first upper insulation layer is disposed on the seal and on a first surface of the second semiconductor chip; and
the first wiring layer is disposed on lateral surfaces and bottom surfaces of third holes in the first upper insulation layer to connect to the second chip pads.

8. The semiconductor package of claim 7, wherein the second wiring layer is disposed on lateral surfaces and bottom surfaces of the first holes in the second upper insulation layer.

9. The semiconductor package of claim 7, wherein the second wiring layer is disposed on lateral surfaces and bottom surfaces of fourth holes that penetrate through the seal, the first upper insulation layer, and the second upper insulation layer, to connect to the first chip pads.

10. The semiconductor package of claim 1, wherein the wiring layer is referred to as a second wiring layer, and wherein the upper insulation layer includes first holes, the semiconductor package further comprising:
a first wiring layer connected to the second wiring layer through the first holes and extending along an upper surface of the seal, wherein the second wiring layer penetrates through the upper insulation layer to connect to the second chip pads; and
a protection layer that covers the upper insulation layer and the second wiring layer and that includes second holes via which portions of the second wiring layer are exposed.

11. The semiconductor package of claim 10, wherein the first wiring layer is connected to the first chip pads through third holes in the seal, wherein the first wiring layer is disposed on lateral surfaces and bottom surfaces of the third holes in the seal to connect to the first chip pads.

12. The semiconductor package of claim 11, wherein:
the upper insulation layer is disposed on the seal and on a first surface of the second semiconductor chip; and
the second wiring layer is disposed on lateral surfaces and bottom surfaces of fourth holes in the upper insulation layer to connect to the second chip pads.

13. The semiconductor package of claim 12, wherein the second wiring layer is disposed on lateral surfaces of the first holes in the upper insulation layer.

14. A semiconductor package comprising:
a first semiconductor chip having a plurality of first chip pads arranged on a first surface of the first semiconductor chip along one side thereof;
a second semiconductor chip stacked on the first surface of the first semiconductor chip in an offset structure such that the first chip pads are exposed;
a seal that seals lateral surfaces of the first semiconductor chip and the second semiconductor chip;
a first upper insulation layer that covers the seal and the second semiconductor chip and exposes second chip pads of the second semiconductor chip that are buried;
a first wiring layer that is connected to the second chip pads through the first upper insulation layer and extends along an upper surface of the first upper insulation layer;
a second upper insulation layer that covers the first upper insulation layer and the first wiring layer and that includes first holes via which portions of the first wiring layer are exposed;
a second wiring layer connected to the first wiring layer through the first holes and extending along an upper surface of the second upper insulation layer; and
a protection layer that covers the second upper insulation layer and the second wiring layer and that includes second holes via which portions of the second wiring layer are exposed,
wherein:
the second wiring layer is connected to the first chip pads through the seal, through the first upper insulation layer, and through the second upper insulation layer;

the semiconductor package further includes protruding pads each including a filler disposed on respective chip pads from among the first chip pads, wherein the protruding pads are configured to reduce a depth by which the second wiring layer penetrates through the seal, through the first upper insulation layer, and through the second upper insulation layer, to connect to the first chip pads;

the first upper insulation layer is disposed on the seal and on a first surface of the second semiconductor chip; and the first wiring layer is disposed on lateral surfaces and bottom surfaces of third holes in the first upper insulation layer to connect to the second chip pads.

15. The semiconductor package of claim 14, wherein the second wiring layer is disposed on lateral surfaces and bottom surfaces of the first holes in the second upper insulation layer.

16. The semiconductor package of claim 15, wherein the second wiring layer is disposed on lateral surfaces and bottom surfaces of fourth holes that penetrate through the seal, the first upper insulation layer, and the second upper insulation layer, to connect to the first chip pads.

17. The semiconductor package of claim 14, further comprising external connection members disposed in the second holes and connected to the second wiring layer.

18. A semiconductor package comprising:

a first semiconductor chip having a plurality of first chip pads arranged on a first surface of the first semiconductor chip along one side thereof;

a second semiconductor chip stacked on the first surface of the first semiconductor chip in an offset structure such that the first chip pads are exposed;

a seal that seals lateral surfaces of the first semiconductor chip and the second semiconductor chip;

an upper insulation layer that covers the seal and the second semiconductor chip and exposes second chip pads of the second semiconductor chip that are buried, wherein the upper insulation layer includes first holes;

a second wiring layer that is connected to the second chip pads through the upper insulation layer and extends along an upper surface of the upper insulation layer;

a first wiring layer connected to the second wiring layer through the first holes and extending along an upper surface of the seal, wherein the second wiring layer penetrates through the upper insulation layer to connect to the second chip pads; and a protection layer that covers the upper insulation layer and the second wiring layer and that includes second holes via which portions of the second wiring layer are exposed, wherein:

the first wiring layer is connected to the first chip pads through third holes in the seal, wherein the first wiring layer is disposed on lateral surfaces and bottom surfaces of the third holes in the seal to connect to the first chip pads;

the upper insulation layer is disposed on the seal and on a first surface of the second semiconductor chip;

the second wiring layer is disposed on lateral surfaces and bottom surfaces of fourth holes in the upper insulation layer to connect to the second chip pads; and the second wiring layer is disposed on lateral surfaces of the first holes in the upper insulation layer.

* * * * *